US012690275B2

(12) United States Patent
Gossner et al.

(10) Patent No.: US 12,690,275 B2
(45) Date of Patent: Jul. 21, 2026

(54) INTEGRATED CIRCUIT STRUCTURES INCLUDING ELASTROSTATIC DISCHARGE BALLASTING RESISTOR BASED ON BURIED POWER RAIL

(71) Applicant: Intel Corporation, Santa Clara, CA (US)

(72) Inventors: Harald Gossner, Riemerling (DE); Georgios Panagopoulos, Munich (DE); Johannes Xaver Rauh, Kirchseeon (DE); Richard Geiger, Munich (DE)

(73) Assignee: Intel Corporation, Santa Clara, CA (US)

( * ) Notice: Subject to any disclaimer, the term of this patent is extended or adjusted under 35 U.S.C. 154(b) by 454 days.

(21) Appl. No.: 17/540,609

(22) Filed: Dec. 2, 2021

(65) Prior Publication Data

US 2023/0178542 A1     Jun. 8, 2023

(51) Int. Cl.
| | |
|---|---|
| *H10D 89/60* | (2025.01) |
| *H10D 84/83* | (2025.01) |
| *H10D 86/40* | (2025.01) |
| *H10D 86/60* | (2025.01) |
| *H10W 20/20* | (2026.01) |

(52) U.S. Cl.
CPC ......... *H10D 89/921* (2025.01); *H10D 89/911* (2025.01); *H10W 20/20* (2026.01); *H10D 84/834* (2025.01); *H10D 86/441* (2025.01); *H10D 86/60* (2025.01)

(58) Field of Classification Search
CPC .................................................. H10D 89/921
See application file for complete search history.

(56) References Cited

U.S. PATENT DOCUMENTS

| | | | |
|---|---|---|---|
| 2022/0013652 A1* | 1/2022 | Yang ..................... | H10D 30/014 |
| 2022/0208757 A1* | 6/2022 | Do .......................... | H10D 89/10 |
| 2023/0036597 A1* | 2/2023 | Smith ................... | H10D 30/014 |

(Continued)

OTHER PUBLICATIONS

Gupta, Anshul et al "Buried Power Rail Integration with FinFETs for Ultimate CMOS Scaling", IEEE Transactions on Electron Devices, vol. 67, No. 12, Dec. 2020, pp. 54349-5354.

(Continued)

*Primary Examiner* — Mounir S Amer
(74) *Attorney, Agent, or Firm* — Akona IP PC

(57)     ABSTRACT

IC structures including BPRs used for ESD ballasting are disclosed. An IC structure includes semiconductor structures of one or more transistors. A semiconductor structure may be a fin, nanowire, or nanoribbon of a semiconductor material. The IC structure also includes an electrically conductive layer coupled to the semiconductor structures, a power rail, and a support structure. The power rail is coupled to the electrically conductive layer by a via. The power rail is buried in a support structure. The combination of the power rail and the via constitutes a ESD ballasting resistor for the semiconductor structures. A resistance of the ESD ballasting resistor can be in a range from 5 to 20 ohms. The IC structure may include two or more power rails. A power rail may be arranged between two of the semiconductor structures. The power rails may form a meander structure with other components of the IC structure.

20 Claims, 16 Drawing Sheets

(56) References Cited

U.S. PATENT DOCUMENTS

2023/0197614 A1\*   6/2023   Majhi  ................. H10W 20/427
                                                            257/774
2023/0377983 A1\*   11/2023   Smith  ................. H10D 84/038

OTHER PUBLICATIONS

Lambert, William J. et al, "Package Inductors for Intel Fully
Integrated Voltage Regulators", IEEE Transactions on Components,
Packaging and Manufacturing Technology, vol. 6, No. 1, Jan. 2016,
pp. 3-11.
Prasad, Divya et al, "Buried Power Rails and Back-side Power
Grids: Arm® CPU Power Delivery Network Design Beyond 5nm",
2019 IEEE International Electron Devices Meeting (IEDM), Dec.
7-11, 2019, pp. 19.1.1-19.1.4.
Ryckaert, J. et al, "Extending the roadmap beyond 3nm through
system scaling boosters: A case study on Buried Power Rail and
Backside Power Delivery", 2019 Electron Devices Technology and
Manufacturing Conference (EDTM) (2019), pp. 50-52.

\* cited by examiner

INTEGRATED CIRCUIT STRUCTURES INCLUDING ELASTROSTATIC DISCHARGE BALLASTING RESISTOR BASED ON BURIED POWER RAIL

TECHNICAL FIELD

This disclosure relates generally to the field of semiconductor devices, and more specifically, to integrated circuit (IC) structures.

BACKGROUND

A field-effect transistor (FET), e.g., a metal-oxide-semiconductor (MOS) FET (MOSFET), is a three-terminal device that includes source, drain, and gate terminals and uses electric field to control current flowing through the device. A FET typically includes a semiconductor channel material, a source region and a drain region provided in the channel material, and a gate stack (also referred to as "gate") that includes at least a gate electrode material and may also include a gate dielectric material, the gate stack provided over a portion of the channel material between the source and the drain regions. Because gate electrode materials often include metals, gates of transistors are commonly referred to as "metal gates."

Recently, FETs with non-planar architectures, such as FinFETs (also sometimes referred to as "wrap around gate transistors" or "tri-gate transistors") and nanosheet or nanoribbon FET (also sometimes referred to as "all-around gate transistors"), have been extensively explored as alternatives to transistors with planar architectures.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
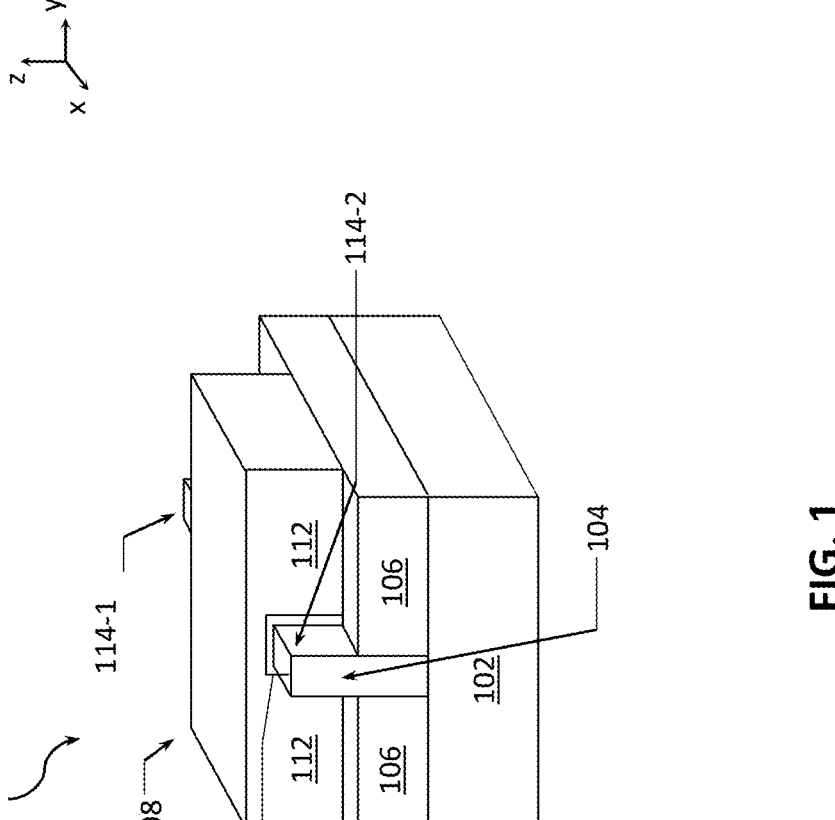
FIG. 1 is a perspective view of an example FinFET, according to some embodiments of the disclosure.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC structures with ESD ballasting resistors based on BPRs, proposed herein, it might be useful to first understand phenomena that may come into play in such structures. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of transistors being implemented as FinFETs, nanoribbon FETs, or nanowire FETs, embodiments of the present disclosure are equally applicable to IC structures employing transistors of other architectures such as to planar transistors.

As used herein, the term "nanoribbon" refers to an elongated semiconductor structure having a longitudinal axis parallel to the support structure over which a memory device is provided. Typically, a length of a such a structure (i.e., a dimension measured along the longitudinal axis, shown in the present drawings to be along the y-axis of an example x-y-z coordinate system) is greater than each of a width (i.e., a dimension measured along the x-axis of the example coordinate system shown in the present drawings) and a thickness/height (i.e., a dimension measured along the z-axis of the example coordinate system shown in the present drawings). In some settings, the terms "nanoribbon" or "nanosheet" have been used to describe elongated semiconductor structures that have a rectangular transverse cross-section (i.e., a cross-section in a plane perpendicular to the longitudinal axis of the structure), while the term "nanowire" has been used to describe similar elongated structures but with circular transverse cross-sections. In the present disclosure, the term "nanoribbon" is used to refer to all such nanowires, nanoribbons, and nanosheets, as well as elongated semiconductor structures with a longitudinal axis parallel to the support structures and with having transverse cross-sections of any geometry (e.g., transverse cross-sections in the shape of an oval or a polygon with rounded corners). A transistor may then be described as a "nanoribbon-based transistor" if the channel of the transistor is a portion of a nanoribbon, i.e., a portion around which a gate stack of a transistor may wrap around. The semiconductor material in the portion of the nanoribbon that forms a channel of a transistor may be referred to as a "channel material," with source and drain (S/D) regions of a transistor provided on either side of the channel material.

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device becomes increasingly significant and such optimization is far from trivial.

Relentless scaling of transistors and wires in advanced semiconductor technologies has not only resulted in major process-related challenges but has also imposed severe design challenges in the sub-5 nm node. Dimensional scaling of designs has been made possible by (i) Front-End-of-Line (FEOL) and Back-End-of-Line (BEOL) pitch scaling, which worsens short-channel effects in transistors and increases wire/contact resistances; and, (ii) fin depopulation in standard cells, which causes degradation of transistor drive. To enable further area scaling in sub-5 nm nodes, an approach of burying the power rails into the substrate has been proposed, which no longer requires reserving two routing tracks for power nets (e.g., VDD or VSS) in the standard cell area. Generally, such an approach includes replacing at least some of the power lines which conventionally run at Mint level with power lines "buried" within the shallow trench isolation (STI) and the support structure (e.g., a substrate, a die, a wafer, or a chip). Such power lines are called BPRs. BPR frees up routing resources at Mint resulting in standard cell height reduction and overall area scaling. Additionally, these BPRs can achieve a higher aspect ratio, thus, exhibiting lower resistance than local level BEOL power rails. Thus, BPRs can be a key scaling booster for complementary metal-oxide-semiconductor (CMOS) extension beyond the 5-nm node.

In IC devices including transistors (e.g., FinFETs, nanoriboon FETs, nanowire FETs, etc.), the drain junctions of transistors connected to I/O pads are susceptible to ESD stress. Under high current conditions like during ESD discharge, a parasitic bipolar current path is triggered. The parasitic bipolar current can lead to a nonuniform current conduction along the width of the IC devices. This degrades the width scaling and the overall ESD current robustness of wide devices. To address this, the measure of ballasting resistance is implemented to guarantee a more uniform current conduction. However, this can lead to a significant increase in area footprint of the wide IC devices. In downscaled scenarios (e.g., the sub-5 nm node devices), this challenge becomes even more prevalent due to small dimensions and tight restrictions in the layout.

In planar technologies (e.g., in 28 nm node CMOS), a common solution in the field is the extension of the drain region by adding a region of blocked silicide between drain contact and gate. Another solution is to add polysilicon resistors or metal resistors in series to the individual fingers of a wide transistor. These measures increase the area consumption of the IO transistor by two to five times. In an advanced FinFET technology, silicide blocking is not always a viable option due to process constraints. Adding polysilicon resistors may be complex in the layout and very area consuming. Therefore, improved technologies are needed to find an optimum ballasting scheme which effectively distributes the ESD current along the width, but has minimum impact on space consumption and performance of IC devices.

The present invention relates to IC structures with ESD ballasting resistors based on BPRs. An example IC structure includes semiconductor structures, an electrically conductive layer connected to the semiconductor structures, and a power rail coupled to the electrically conductive layer through a via. The semiconductor structures are semiconductor structures of one or more transistors. The transistors may be NMOS (N-type metal-oxide-semiconductor) or PMOS (P-type metal-oxide-semiconductor) transistors. The semiconductor structures may include semiconductor materials shaped as fins, nanowires, nanosheets, or other types of semiconductor structures. The electrically conductive layer may function as a power plane or ground plane of the IC structure and provide power to the semiconductor structures. The power rail is buried in a support structure (e.g., a substrate) of the IC structure. The support structure includes a semiconductor layer, which is a layer including a semiconductor material, and an insulator layer, which is a layer including an electrically insulating material. The power rail and the via are part of the power delivery path for the drain region of the transistor. The combination of the power rail and the via constitutes an ESD ballasting resistor for the semiconductor structures of the transistor.

The IC structure may include two BPRs, one coupled to the power plane and the other one coupled to the ground plane. In an embodiment, both of the two BPRs may be used for ESD ballasting. In some embodiments, the IC structure includes more than two BPRs that are used for ESD ballasting for multiple transistors. A BPR and its corresponding via (e.g., the via coupling the BPR to the power or ground plane) may be arranged between two adjacent transistors or between two semiconductor structures of the same transistor. A pair of BPR and via may function as a ESD ballasting resistor for a single semiconductor structure or multiple semiconductor structures of a transistor. The BPR and its corresponding via can make the current flow more uniform across all the semiconductor structures coupled to the BPR. A resistance of the pair of BPR and via is in a range that is high enough for ESD protection but low enough for efficient power delivery. An example of the range is 5 to 20 ohm. In some embodiments, the BPRs, together with vias connected to the BPRs and metal layers coupled to the BPRs, may form a meander structure to increase space efficiency. In the meander structure, the BPRs can be arranged in parallel to each other, so that a number of BPRs can be placed in the limited space in the substrate of the IC structure. That way, the resistance for electrostatic discharge (EDS) ballasting can be maximized within the limited spaced.

The present invention uses the BPRs and vias coupling BPRs to power/ground plane for both power delivery and ESD ballasting. The resistance of the BPR (e.g., 50 ohm/μm) plus the resistance of the via provides enough ballasting to spread the current more uniformly. Also, the ballasting can be implemented per semiconductor structure or per group of semiconductor structures. Compared with conventional technologies using additional ESD ballasting resistors, the present invention implements a space efficient ballasting concept for transistors. The present invention can further reduce space consumption by using the meander structure.

Elongated structures are mentioned throughout the present description. As used herein, a structure is referred to as an elongated if a length of the structure (measured alone one axis of an example coordinate system) is greater than both a width of the structure (measured along another axis of the example coordinate system) and a height of the structure (measured along a third axis of the example coordinate system). For example, elongated semiconductor structures as described herein may be fins or nanoribbons, having a length measured along an x-axis of the coordinate system shown in the present drawings, a width measured along a y axis of the coordinate system shown in the present drawings, and a height measured along a z-axis of the coordinate system shown in the present drawings. Because BPRs described herein, as well as openings above them, are substantially parallel to the semiconductor structures, their lengths, widths, and heights are also measured along, respectively, an x-axis, a y axis, and a z-axis of the x-y-z coordinate system shown in the present drawings. On the other hand, when the metal gate lines are substantially perpendicular to the semiconductor structures, as shown in the embodiments of the present drawings, their lengths, widths, and heights are measured along, respectively, a y axis, an x-axis, and a z-axis of the x-y-z coordinate system shown.

While some of the descriptions provided herein refer to FinFETs, these descriptions are equally applicable to embodiments any other non-planar FETs besides FinFETs, e.g., to nanoribbon transistors, nanowire transistors, or transistors such as nanoribbon/nanowire transistors but having transverse cross-sections of any geometry (e.g., oval, or a polygon with rounded corners).

IC structures as described herein, in particular IC structures with ESD ballasting resistors based on BPRs as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials, and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, such a collection may be referred to herein without the letters.

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number of channels, a certain number of electrically conductive layers, a certain number of BPRs, a certain number of vias, a certain number of TSVs, etc.), this is simply for ease of illustration, and more, or less, than that number may be included in an IC structure with at least one BPR as described herein. Still further, various views shown in some of the drawings are intended to show relative arrangements of various elements therein. In other embodiments, various IC structures with BPRs as described herein, or portions thereof, may include other elements or components that are not illustrated (e.g., transistor portions, various components that may be in electrical contact with any of the transistors, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of IC structures with BPRs as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D" region/contact to indicate that the region/contact can be either a source region/contact, or a drain region/contact.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, a term "interconnect" may be used to describe any element formed of an electrically conductive material for providing electrical connectivity to one or more components associated with an IC or/and between various such components. In general, the "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of an IC chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC chip or a support structure over which an IC structure is provided and may interconnect two conductive lines in adjacent levels or two conductive lines in not adjacent levels. A term "metallization stack" may be used to refer to a stack of one or more interconnects for providing connectivity to different circuit components of an IC chip.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20%, e.g, within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example FET

FIG. 1 is a perspective view of an example FinFET 100, according to some embodiments of the disclosure. The FinFET 100 illustrates one example of transistors that may be implemented in various IC structures described herein, e.g., in the IC structures with ESD ballasting resistors based on BPRs as shown in FIGS. 4-12. The FinFET 100 shown in FIG. 1 is intended to show relative arrangement(s) of some of the components therein. In various embodiments, the FinFET 100, or portions thereof, may include other components that are not illustrated (e.g., any further materials, such as spacer materials, surrounding the gate stack of the FinFET 100, electrical contacts to the S/D regions of the FinFET 100, etc.).

As shown in FIG. 1, the FinFET 100 may be provided over a support structure 102, where the term "support structure" (which may also be referred to as a "base") may refer to any suitable support structure on which a transistor may be built, e.g., a substrate, a die, a wafer, or a chip. As also shown in FIG. 1, the FinFET 100 may include a fin 104, extending away from the support structure 102. A portion of the fin 104 that is closest to the support structure 102 may be enclosed by an insulator material 106, commonly referred to as a "STI." The portion of the fin 104 enclosed on its' sides by the insulator material 106 is typically referred to as a "subfin portion" or simply a "subfin." As further shown in FIG. 1, a gate stack 108 that includes at least a layer of a gate electrode 112 and, optionally, a layer of a gate dielectric 110, may be provided over the top and sides of the remaining upper portion of the fin 104 (e.g., the portion above and not enclosed by the insulator material 106), thus wrapping around the upper-most portion of the fin 104. The portion of the fin 104 over which the gate stack 108 wraps around may be referred to as a "channel portion" (or, simply, a "channel") of the fin 104 because this is where, during operation of the FinFET 100, a conductive channel may form. The channel portion of the fin 104 is a part of an active region of the fin 104. A first S/D region 114-1 and a second S/D region 114-2 (also commonly referred to as "diffusion regions") are provided on the opposite sides of the gate stack 108, forming source and drain terminals of the FinFET 100.

In general, implementations of the present disclosure may be formed or carried out on a support structure such as a semiconductor substrate, composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which IC structures with BPRs as described herein may be built falls within the spirit and scope of the present disclosure. In various embodiments, the support structure 102 may include any such substrate material that provides a suitable surface for forming the FinFET 100.

As shown in FIG. 1, the fin 104 may extend away from the support structure 102 and may be substantially perpendicular to the support structure 102. The fin 104 may include one or more semiconductor materials, e.g., a stack of semiconductor materials, so that the upper-most portion of the fin (namely, the portion of the fin 104 enclosed by the gate stack 108) may serve as the channel region of the FinFET 100. Therefore, as used herein, the term "channel material" of a transistor may refer to such upper-most portion of the fin 104, or, more generally, to any portion of one or more semiconductor materials in which a conductive channel between source and drain regions may be formed during operation of a transistor.

As shown in FIG. 1, the insulator material 106 may enclose the sides of the fin 104. A portion of the fin 104 enclosed by the insulator material 106 forms a subfin. In various embodiments, the insulator material 106 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the insulator material 106 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 104, the gate stack 108 may wrap around the fin 104 as shown in FIG. 1. In particular, the gate dielectric 110 may wrap around the upper-most portion of the fin 104, and the gate electrode 112 may wrap around the gate dielectric 110. The interface between the channel portion of the fin 104 and the subfin portion of the fin 104 is located proximate to where the gate electrode 112 ends.

The gate electrode 112 may include one or more gate electrode materials, where the choice of the gate electrode materials may depend on whether the FinFET 100 is a PMOS transistor or an NMOS transistor. For a PMOS transistor, gate electrode materials that may be used in different portions of the gate electrode 112 may include, but are not limited to, ruthenium, palladium, platinum, cobalt, nickel, and conductive metal oxides (e.g., ruthenium oxide). For an NMOS transistor, gate electrode materials that may be used in different portions of the gate electrode 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 112 may include a stack of a plurality of gate electrode materials, where zero or more materials of the stack are workfunction materials and at least one material of the stack is a fill metal layer. Further materials/layers may be included next to the gate electrode 112 for other purposes, such as to act as a diffusion barrier layer or/and an adhesion layer.

If used, the gate dielectric 110 may include a stack of one or more gate dielectric materials. In some embodiments, the gate dielectric 110 may include one or more high-k dielectric materials. In various embodiments, the high-k dielectric materials of the gate dielectric 110 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the FinFET 100 to improve the quality of the gate dielectric 110.

In some embodiments, the gate stack 108 may be surrounded by a dielectric spacer, not specifically shown in FIG. 1. The dielectric spacer may be configured to provide separation between the gate stacks 108 of different FinFETs 100 which may be provided along a single fin (e.g., different FinFETs provided along the fin 104, although FIG. 1 only illustrates one of such FinFETs), as well as between the gate stack 108 and the source/drain contacts disposed on each side of the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a dielectric spacer is used, then the lower portions of the fin 104, e.g., the subfin portion of the fin 104, may be surrounded by the insulator material 106 which may, e.g., include any of the high-k dielectric materials described herein.

In some embodiments, the fin 104 may be composed of semiconductor material systems including, for example, N-type or P-type materials systems. In some embodiments, the fin 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 104 may include a combination of semiconductor materials where one semiconductor material is used for the channel portion and another material, sometimes referred to as a "blocking material," is used for at least a portion of the subfin portion of the fin 104. In some embodiments, the subfin and the channel portions of the fin 104 are each formed of monocrystalline semiconductors, such as e.g., Si or Ge. In a first embodiment, the subfin and the channel portion of the fin 104 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For some example N-type transistor embodiments (i.e., for the embodiments where the FinFET 100 is an NMOS), the channel portion of the fin 104 may advantageously include a III-V material having a high electron mobility, such as, but not limited to InGaAs, InP, InSb, and InAs. For some such embodiments, the channel portion of the fin 104 may be a ternary III—V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 104 may be an intrinsic III-V material, i.e., a III-V semiconductor material not intentionally doped with any electrically active impurity. In alternate embodiments, a nominal impurity dopant level may be present within the channel portion of the fin 104, for example to further fine-tune a threshold voltage Vt, or to provide HALO pocket implants, etc. Even for impurity-doped embodiments however, impurity dopant level within the channel portion of the fin 104 may be relatively low, for example below $10^{15}$ dopant atoms per cubic centimeter ($cm^{-3}$), and advantageously below $10^{13}$ $cm^{-3}$. The subfin portion of the fin 104 may be a III-V material having a band offset (e.g., conduction band offset for N-type devices) from the channel portion. Example materials include, but are not limited to, GaAs, GaSb, GaAsSb, GaP, InAlAs, GaAsSb, AlAs, AlP, AlSb, and AlGaAs. In some N-type transistor embodiments of the FinFET 100 where the channel portion of the fin 104 is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 104 each include group IV semiconductors (e.g., Si, Ge, SiGe). The subfin of the fin 104 may be a first elemental semiconductor (e.g., Si or Ge) or a first SiGe alloy (e.g., having a wide bandgap).

For some example P-type transistor embodiments (i.e., for the embodiments where the FinFET 100 is a PMOS), the channel portion of the fin 104 may advantageously be a group IV material having a high hole mobility, such as, but not limited to Ge or a Ge-rich SiGe alloy. For some example embodiments, the channel portion of the fin 104 may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the fin 104, for example to further set a threshold voltage Vt, or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. The subfin of the fin 104 may be a group IV material having a band offset (e.g., valance band offset for P-type devices) from the channel portion. Example materials include, but are not limited to, Si or Si-rich SiGe. In some P-type transistor embodiments, the subfin of the fin 104 is Si and at least a portion of the subfin may also be doped with impurities (e.g., N-type) to a higher impurity level than the channel portion.

Turning to the first S/D region 114-1 and the second S/D region 114-2 on respective different sides of the gate stack 108, in some embodiments, the first S/D region 114-1 may be a source region and the second S/D region 114-2 may be a drain region. In other embodiments this designation of source and drain may be interchanged, i.e., the first S/D region 114-1 may be a drain region and the second S/D region 114-2 may be a source region. Although not specifically shown in FIG. 1, the FinFET 100 may further include S/D electrodes (also commonly referred to as "S/D contacts"), formed of one or more electrically conductive materials, for providing electrical connectivity to the S/D regions 114, respectively. Such S/D contacts are shown as S/D contacts 408 in FIGS. 4B and 5B. In some embodiments, the S/D regions 114 of the FinFET 100 may be regions of doped semiconductors, e.g., regions of doped channel material of the fin 104, so as to supply charge carriers for the transistor channel. In some embodiments, the S/D regions 114 may be highly doped, e.g., with dopant concentrations of about $1·10^{21}$ $cm^{-3}$, in order to advantageously form Ohmic contacts with the respective S/D electrodes, although these regions may also have lower dopant concentrations and may form Schottky contacts in some implementations. Irrespective of the exact doping levels, the S/D regions 114 of the FinFET 100 are the regions having dopant concentration higher than in other regions, e.g., higher than a dopant concentration in a region of the semiconductor channel material between the first S/D region 114-1 and the second S/D region 114-2, and, therefore, may be referred to as "highly doped" (HD) regions.

In some embodiments, the S/D regions 114 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the fin 104 to form the S/D regions 114. An annealing process that activates the dopants and causes them to diffuse further into the fin 104 may follow the ion implantation process. In the latter process, the one or more semiconductor materials of the fin 104 may first be etched to form recesses at the locations for the future source and drain regions. An epitaxial deposition process may then be carried out to fill the recesses with material (which may include a combination of different materials) that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. Although not specifically shown in the perspective illustration of FIG. 1, in further embodiments, one or more layers of metal and/or metal alloys may be used to form the source and drain contacts (i.e., electrical contacts to each of the S/D regions 114). Such S/D contacts are shown, e.g., in FIGS. 4B and 5B of the present drawings.

The FinFET 100 may have a gate length, GL, (e.g., a distance between the first S/D region 114-1 and the second S/D region 114-2), a dimension measured along the fin 104 in the direction of the x-axis of the example reference coordinate system x-y-z shown in FIG. 1, which may, in some embodiments, be between about 5 and 40 nanometers, including all values and ranges therein (e.g., between about 10 and 35 nanometers, or between about 15 and 25 nanometers). The fin 104 may have a thickness, a dimension measured in the direction of the y axis of the reference coordinate system x-y-z shown in FIG. 1, that may, in some embodiments, be between about 4 and 15 nanometers, including all values and ranges therein (e.g., between about 5 and 10 nanometers, or between about 7 and 12 nanometers). The fin 104 may have a height, a dimension measured in the direction of the z-axis of the reference coordinate system x-y-z shown in FIG. 1, which may, in some embodiments, be between about 30 and 350 nanometers, including all values and ranges therein (e.g., between about 30 and 200 nanometers, between about 75 and 250 nanometers, or between about 150 and 300 nanometers).

Although the fin 104 illustrated in FIG. 1 is shown as having a rectangular cross-section in a z-y plane of the reference coordinate system shown in FIG. 1, the fin 104 may instead have a cross-section that is rounded or sloped at the "top" of the fin 104, and the gate stack 108 (including the different portions of the gate dielectric 110) may conform to this rounded or sloped fin 104. In use, the FinFET 100 may form conducting channels on up to three "sides" of the channel portion of the fin 104, potentially improving performance relative to single-gate transistors (which may form conducting channels on one "side" of a channel material or substrate) and double-gate transistors (which may form conducting channels on two "sides" of a channel material or substrate).

While FIG. 1 illustrates a single FinFET 100, in some embodiments, a plurality of FinFETs may be arranged next to one another (with some spacing in between) along the fin 104.

In a FinFET, a semiconductor structure shaped as a fin extends away from a base (e.g., from a semiconductor substrate), and a gate stack may wrap around the upper portion of the fin (i.e., the portion farthest away from the base), potentially forming a gate on 3 sides of the fin. The portion of the fin around which the gate stack wraps around is referred to as a "channel" or a "channel portion" of a FinFET. A semiconductor material of the channel portion is commonly referred to as a "channel material" of the transistor. A source region and a drain region are provided in the fin on the opposite sides of the gate stack, forming, respectively, a source and a drain of a FinFET.

Figure 2:
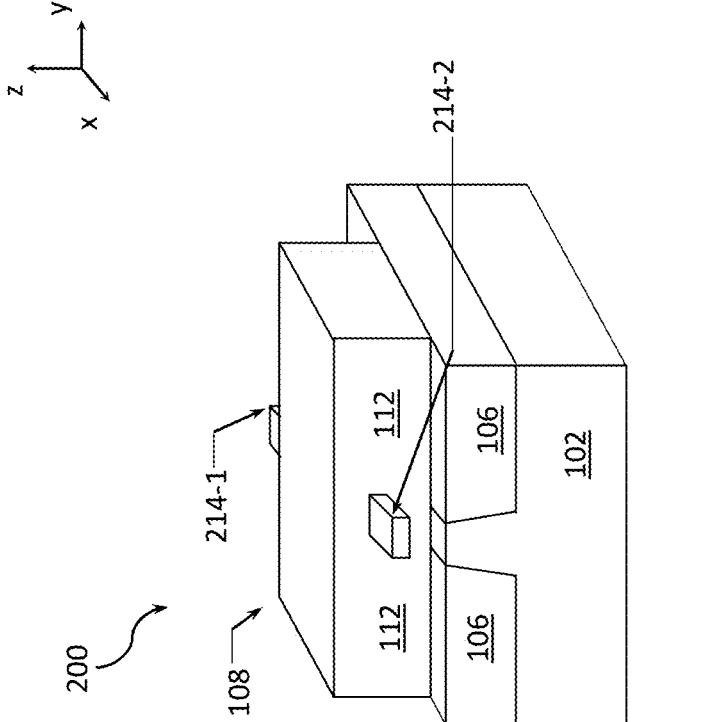
FIG. 2 is a perspective view of an example nanoribbon FET, according to some embodiments of the disclosure.

FIG. 2 is a perspective view of an example nanoribbon FET 200, according to some embodiments of the disclosure. The nanoribbon FET 200 illustrates one example of transistors that may be implemented in various IC structures described herein, e.g., in the IC structures with ESD ballasting resistors based on BPRs as shown in FIGS. 4-12. The nanoribbon FET 200 is intended to show relative arrangement(s) of some of the components therein. In various embodiments, the nanoribbon FET 200, or portions thereof, may include other components that are not illustrated (e.g., any further materials, such as spacer materials, surrounding the gate stack of the nanoribbon FET 200, electrical contacts to the S/D regions of the nanoribbon FET 200, etc.).

For purpose of simplicity and illustration, the nanoribbon FET 200 includes the support structure 102, gate stack 108, insulator material 106, and gate electrode 112 in FIG. 1. However, in lieu of the fins in FIG. 1, the gate stack 108 in the nanoribbon FET 200 is provided around portions of elongated semiconductor structures called "nanoribbons" 214, forming a gate on all sides of the nanoribbons 214.

In an embodiment, the nanoribbons 214 are elongated semiconductor structures, each of which has a substantially rectangular transverse cross-section, i.e., the cross-section in the x-z plane. In FIG. 2, the nanoribbon FET 200 includes two nanoribbons 214-1 and 214-2. The "channel" or the "channel portion" of the nanoribbon FET 200 is the portion of each nanoribbon 214-1 or 214-2, around which the gate stack 108 wraps around. A source region and a drain region are provided in the nanoribbon 214 on each side of the gate stack, forming, respectively, a source and a drain of the nanoribbon FET 200. In some embodiments, the nanoribbon FET 200 includes nanoribbons 214 stacked on top of each other, e.g., arranged along the z-axis, for each of the source and drain regions.

Figure 3:
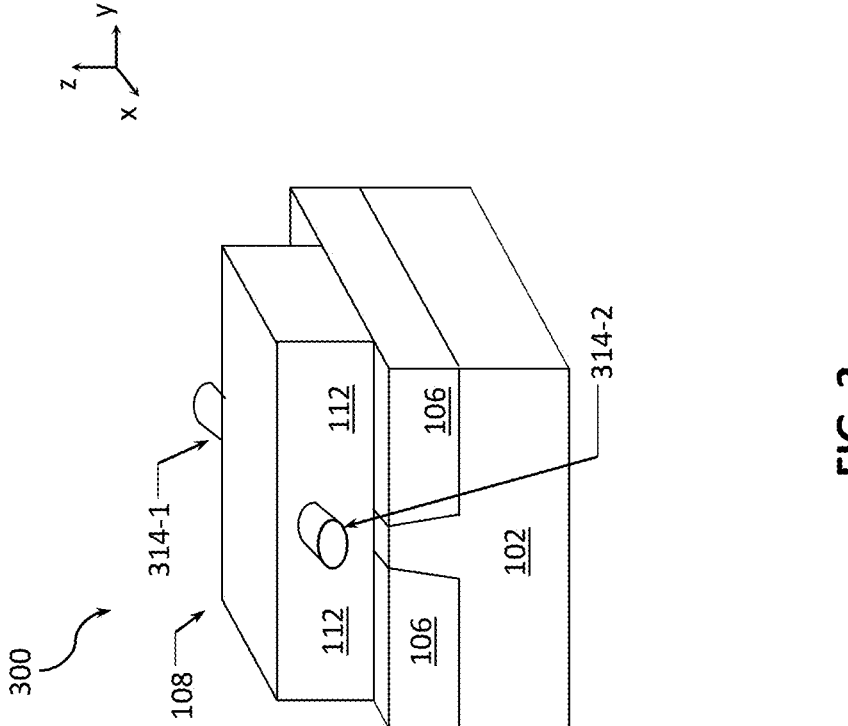
FIG. 3 is a perspective view of an example nanowire FET, according to some embodiments of the disclosure.

FIG. 3 is a perspective view of an example nanowire FET 300, according to some embodiments of the disclosure. The nanowire FET 300 illustrates one example of transistors that may be implemented in various IC structures described herein, e.g., in the IC structures with ESD ballasting resistors based on BPRs as shown in FIGS. 4-12. The nanowire FET 300 is intended to show relative arrangement(s) of some of the components therein. In various embodiments, the nanowire FET 300, or portions thereof, may include other components that are not illustrated (e.g., any further materials, such as spacer materials, surrounding the gate stack of the nanowire FET 300, electrical contacts to the S/D regions of the nanowire FET 300, etc.).

For purpose of simplicity and illustration, the nanowire FET 300 includes the support structure 103, gate stack 108, insulator material 106, and gate electrode 113 in FIG. 1. However, in lieu of the fins in FIG. 1, the gate stack 108 in the nanowire FET 300 is provided around portions of elongated semiconductor structures called "nanowire" 314, forming a gate on all sides of the nanowires 314. Different from the nanoribbon 214, the nanowire 314 has a substantially circular transverse cross-section. In FIG. 3, the nanowire FET 300 includes two nanowires 314-1 and 314-2. The "channel" or the "channel portion" of the nanowire FET 300 is the portion of each nanowire 314-1 or 314-2, around which the gate stack 108 wraps around. A source region and a drain region are provided in the nanowire 314 on each side of the gate stack, forming, respectively, a source and a drain of the nanowire FET 300. In some embodiments, the nanowire FET 300 includes nanowires 314 stacked on top of each other, e.g., arranged along the z-axis, for each of the source and drain regions.

Figure 4:
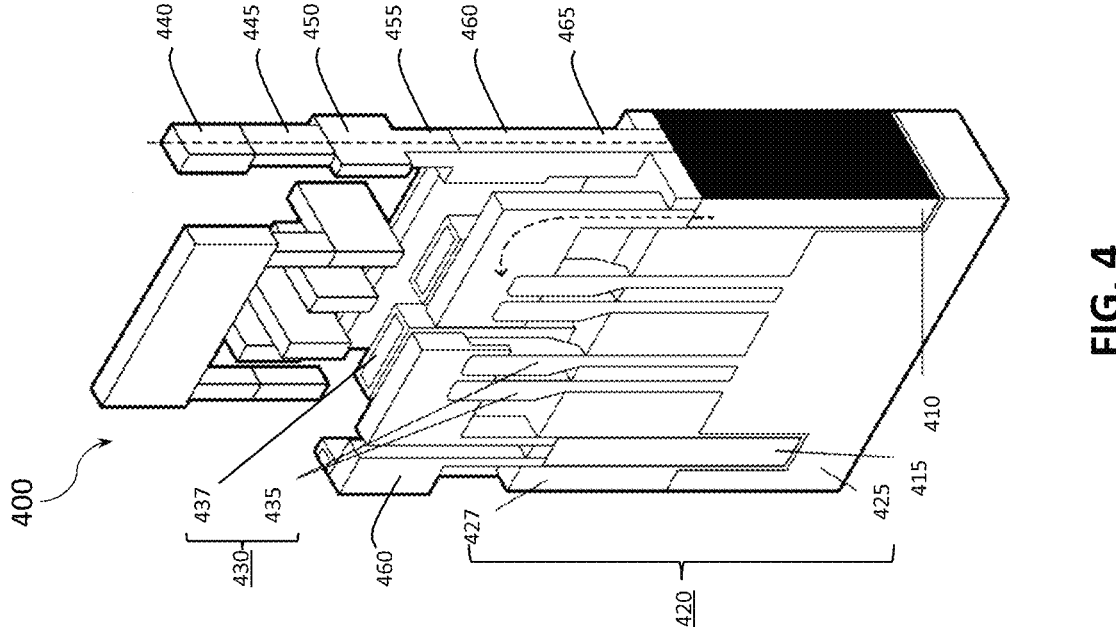
FIG. 4 is a perspective view of an example IC structure including buried power rails (BPRs) for front-side power delivery and electrostatic discharge (ESD) ballasting, according to some embodiments of the disclosure.
Figure 5:
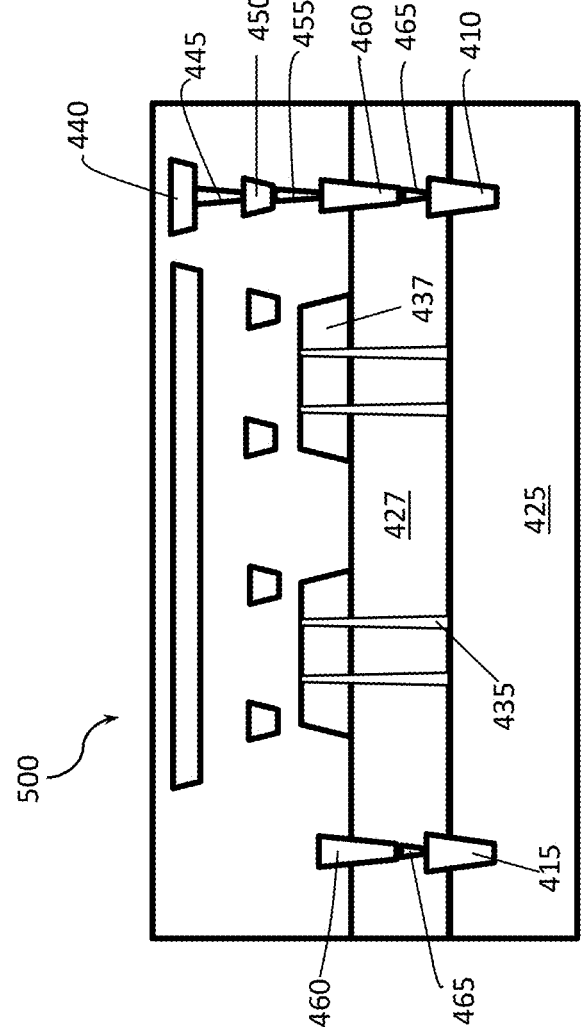
FIG. 5 is a cross-sectional view of the example IC structure in FIG. 4, according to some embodiments of the disclosure.

FIG. 4 is a perspective view of an example IC structure 400 including BPRs 410 and 415 for front-side power delivery and ESD ballasting, according to some embodiments of the disclosure. FIG. 5 is a cross-sectional view 500 of the IC structure 400 in FIG. 4, according to some embodiments of the disclosure. The IC structure 400 also includes a support structure 420, transistors 430 (individually referred to as "transistor 430"), electrically conductive layers 440, 450, and 460, and vias 445, 455, and 465. In other embodiments, the IC structure 400 may include more, fewer, or different components. In some embodiments, the components of the IC structure 400 may be arranged differently. For instance, the electrically conductive layer 440 may be arranged below the semiconductor layer 425 for backside power delivery.

The BPRs 410 and 415 are buried in the support structure 420. The support structure 420 includes a semiconductor layer 425 and an insulator layer 427. A portion of each BPR 410 or 415 is buried in the semiconductor layer 425, and the remaining portion of the BPR 410 or 415 is buried in the insulator layer 427. The semiconductor layer 425 is a layer of a semiconductor material. The semiconductor layer 425 may be a substrate, a die, a wafer, a chip, etc. Examples of the semiconductor material include, for example, single crystal silicon, polycrystalline silicon, silicon-on-insulator (SOI), other suitable semiconductor material, or some combination thereof. The semiconductor layer 425 may also include other materials, such as metal, dielectric, dopant, and so on. In FIG. 4, the semiconductor layer 425 has a top surface and a bottom surface. The top surface of the semiconductor layer 425 contacts with the bottom surface of the insulator layer 427. The bottom surface of the semiconductor layer 425 is the bottom surface of the support structure 420, which can be referred to as the backside of the IC structure 400.

The insulator layer 427 is a layer of an electrically insulating material. The insulator layer 427 functions as an insulator that isolates conducting and semiconducting materials from each other. In some embodiments, the insulator layer 427 is a layer of silicon oxide, $SiO_x$, where x is an integer number, such as 2, 4, etc. The insulator layer 427 adjoins the semiconductor layer 425. As shown in FIG. 4, the insulator layer 427 is above the semiconductor layer 425. In some embodiments, the insulator layer 427 is not a continuous insulator layer. Rather, the insulator layer 427 includes discrete insulator sections arranged in the semiconductor material of the semiconductor layer 425. The discrete insulator sections can insulate BPRs from the semiconductor material. The discrete insulator sections can also insulate semiconductor structures, which are formed in the semiconductor layer 425, of transistors from each other. The discrete insulator sections may include an oxide of the semiconductor material and can be formed from portions of the semiconductor layer 425.

In some embodiments, the insulator layer 427 may be formed by transforming a portion of a silicon substrate into silicon oxide. Silicon exposed to ambient conditions has a native oxide on its surface. The native oxide is approximately 3 nm thick at room temperature. However, 3 nm may be too thin for most applications and a thicker oxide layer needs to be grown. This is done by consuming the underlying Si to form SiOx. This is a grown layer. It is also possible to grow SiOx by a chemical vapor deposition process using Si and O precursor molecules. In this embodiment, the underlying Si in the wafer is not consumed. This is called a deposited layer. In some embodiments, the insulator layer 427 helps in protecting the components in the IC structure 400 from contamination, both physical and chemical. Thus, it acts as a passivating layer. The insulator layer 427 can protect the components from scratches and it also prevents dust from interacting with the components, and thus minimizes contamination. The insulator layer 427 also protects the components from chemical impurities, mainly electrically active contaminants. SiOx acts as a hard mask for doping and as an etch stop during patterning.

The BPRs 410 and 415 are electrically conductive. The BPRs 410 and 415 are coupled to one or more power sources and to semiconductor devices in the IC structure 400 (such as the transistors 430) to provide power to the semiconductor devices. A portion of each BPR 410 or 415 is buried in the insulator layer 427. The remaining portion of each BPR 410 or 415 is buried in the semiconductor layer 425. The BPRs 410 and 415 may be made of a metal, such as tungsten (W), ruthenium (Ru), cobalt (Co), other metals, or some combination thereof. Each BPR 410 or 415 may include a dielectric barrier on its surface that touches the semiconductor layer 425. The dielectric barrier can insulate the metal in the BPR 410 or 415 from the semiconductor material of the semiconductor layer 425. The dielectric barrier may be an oxide barrier made from an oxide material.

The electrically conductive layers 440, 450, and 460 are built in the IC structure 400 to provide power and signal to the semiconductor devices in the IC structure 400. An electrically conductive layer is a layer comprising an electrically conductive material, such as metal. In an embodiment, the electrically conductive layers 440 and 460 are used for power delivery but the electrically conductive layer 450 is used for signal delivery. In some embodiments, the electrically conductive layer 460 is referred to as "M0," the electrically conductive layer 450 is referred to as "Mint," and the electrically conductive layer 440 is referred to as "M1," given the sequence of producing the electrically conductive layers 440, 450, and 460 in the process of fabricating the IC structure 400. The electrically conductive layers 440, 450, and 460 can be made of copper or other types of metals. Each electrically conductive layer 440, 450, or 460 includes multiple sections that can be separated and insulated from each other.

The BPRs 410 and 415, electrically conductive layers 440, 450, and 460, and vias 445, 455, and 465 constitute a conducting path (shown by the dashed lines in FIG. 4) for power delivery network, as indicated by the dotted line in FIG. 4. The vias 445, 455, and 465 are conducting. In one embodiment, some or all of the vias 445, 455, and 465 are made of copper or other types of metal. The vias 445 are between the electrically conductive layers 440 and 450 to couple the two electrically conductive layers 440 and 450 to each other. As shown in FIG. 4, there are three vias 445 between the electrically conductive layers 440 and 450. Each via 445 is for connecting a section of the electrically conductive layer 440 to a corresponding section of the electrically conductive layer 450. In other embodiments, there can be fewer or more vias 445 to connect the electrically conductive layers 440 and 450. Similarly, the via 455 is between the electrically conductive layers 450 and 460. The vias 465 connect the BPRs 410 and 415 to the electrically conductive layer 460. In FIG. 4, there are two vias 465 connecting the BPR 410 to the electrically conductive layer 460 and two vias 465 connecting the BPR 415 to the electrically conductive layer 460. The electrically conductive layer 460 is connected to the transistors 430, particularly semiconductor structures 435 of the transistors 430. A transistor 430 includes semiconductor structures 435 (individually referred to as "semiconductor structure 435") and a gate 437. A semiconductor structure 435 may be a fin, nanoribbon, or nanowire of a semiconductor material. The gate 437 has a first portion at least partially wrapping around a portion of a semiconductor structure 435 on a source region of the transistor 430. The gate 437 also has a second portion at least partially wrapping around a portion of another semiconductor structure 435 on a drain region of the transistor 430. An embodiment of the gate 437 is the gate stack 108 in FIGS. 1-3. A transistor 430 may be a NMOS or PMOS transistor.

In an example, the electrically conductive layer 440 functions as the power plane of the IC structure 400. A positive or negative voltage, for example, can be provided to the electrically conductive layer 440 so that the BPR 410 is electrically biased. The BPR 415 is grounded so that there is an electric potential difference between the BPRs 410 and 415, which transfers to the electric potential difference between the transistors 430. As the electrically conductive layer 440 is on top of the transistors 430, the power delivery network is called "front-side power delivery network." In other embodiments, the IC structure 400 may include an electrically conductive layer below the transistors 430, e.g., at the backside of the IC structure 400. The electrically conductive layer may function as the power plane, ground plane, or both to form "backside power delivery network". The BPRs 410 and 415 can be connected to the electrically conductive layer with TSVs. The TSVs are below the BPRs 410 and 415 and buried in the semiconductor layer 425. The TSVs may be micro-TSVs or nano-TSVs. More details regarding backside power delivery network are described below in conjunction with FIG. 6.

The power delivery network of the IC structure 400 can be a network of interconnect that is separate from the signal network. For instance, portions of the electrically conductive layer 450 that are not in the power delivery network can be used to deliver signals.

In some embodiments, the BPR 410 or 415 and the corresponding vias 465 (i.e., the vias 465 that connect the BPR 410 or 415 to the electrically conductive layer 460) can function as an ESD ballasting resistor for the corresponding transistor 430. The resistance of the combination of the BPR 410 or 415 and the corresponding vias 465 is in a range that is high enough to function as an ESD ballasting resistor but low enough to efficiently deliver power to the transistor 430. An embodiment of the resistance range is from 5 to 20 ohm. More details regarding the ESD ballasting resistor are provided below in conjunction with FIGS. 6-10.

In some embodiments, the IC structure 400 is fabricated through a sequence of processes. Well formation is done as the first step. The first step comprises, for example, ion implantation and dopant activation anneal. Alternatively, well formation can be done after the fin reveal step. Subsequently, fin patterning and oxide layer formation are carried out. The oxide layer formation step may include silicon oxide deposition, silicon oxide anneal, and chemical mechanical polishing (CMP). The BPRs 410 and 415 are formed in the next step, which includes patterning BPR trench into the support structure 420. Subsequently, a dielectric barrier may be deposited onto the outer surfaces of the BPRs 410 and 415 (i.e., the surfaces touching the semiconductor layer 425) to electrically isolate the BPRs 410 and 415 from the semiconductor layer 425. In some embodiments, the step of forming the BPRs 410 and 415 may further include metal CMP and silicon oxide anneal. Next, fin reveal is carried out, e.g., by etching, to reveal the fins. After that, the electrically conductive layers 440, 450, and 460 and vias 445, 455, and 465 are integrated into the IC structure 400.

Figure 6:
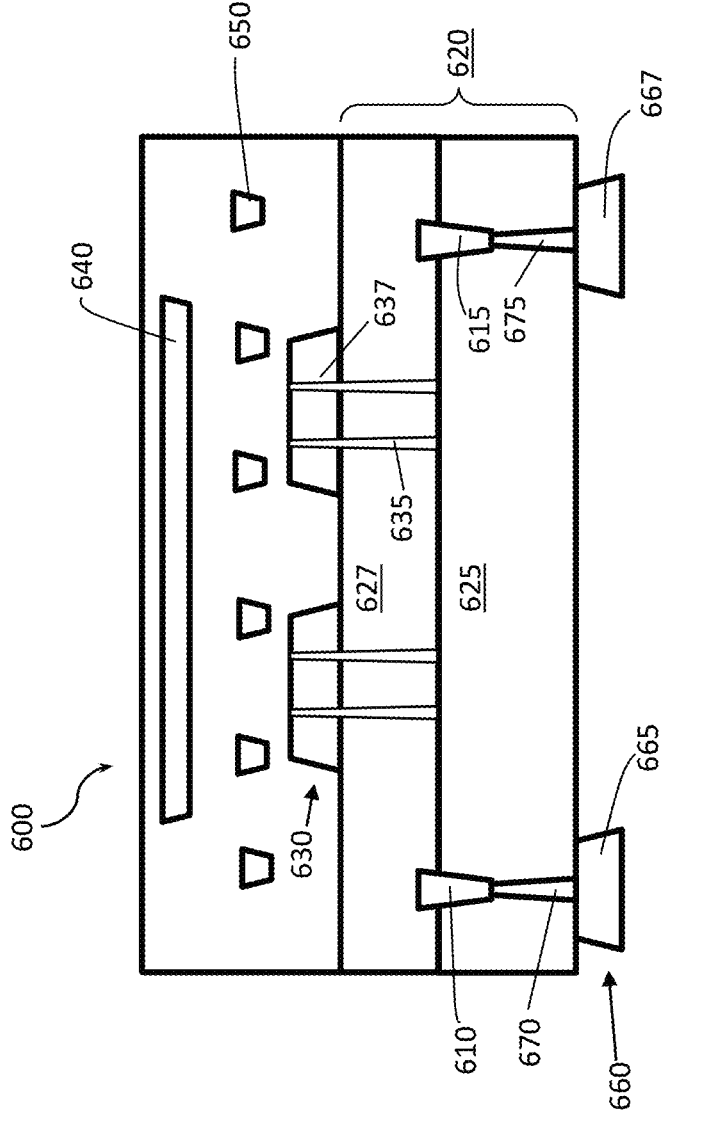
FIG. 6 is a cross-sectional view of an example IC structure including BPRs for backside power delivery and ESD ballasting, according to some embodiments of the disclosure.

FIG. 6 is a cross-sectional view of an example IC structure 600 including BPRs 610 and 615 for backside power delivery and ESD ballasting, according to some embodiments of the disclosure. The IC structure 600 in FIG. 6 includes the BPRs 610 and 615, a support structure 620, two transistors 630 (individually referred to as "transistor 630"), electrically conductive layers 640, 650, and 660, and TSVs 670 and 675. An electrically conductive layer is a layer including an electrically conductive material, such as metal. The electrically conductive layers 640, 650, and 660, and TSVs 670 and 675 may include the same electrically conductive material or different electrically conductive materials. In other embodiments, the IC structure 600 includes fewer, more, or different components.

The BPRs 610 and 615 are buried in the support structure 620. The support structure 620 may be the same or similar to the support structure 420 in FIGS. 4 and 5. The support structure 620 includes a semiconductor layer 625 and an insulator layer 627. A portion of each BPR 610 or 615 is buried in the insulator layer 627, and the remaining portion of the BPR 610 or 615 is buried in the semiconductor layer 625.

The electrically conductive layer 660 is at the backside of the IC structure 600, which is the bottom surface of the support structure 620. The electrically conductive layer 660 includes two sections 665 and 667. The BPRs 610 and 615 are connected to the two sections 665 and 667 of the electrically conductive layer 660 with TSVs 670 and 675, respectively. The TSVs 670 and 675 are buried in the semiconductor layer 625. In some embodiments, the TSVs 670 and 675 are micro-TSVs or nano-TSVs. In one embodiment, the two sections 665 and 667 of the electrically conductive layer 660 function as the power and ground planes, respectively, to provide power to the transistors 630. As the electrically conductive layer 660 is at the backside of the IC structure 600, the BPRs 610 and 615 together with the electrically conductive layer 660 and TSVs 670 and 675 constitute a backside power delivery network.

The transistors 630 each includes semiconductor structures 635 (individually referred to as "semiconductor structure 635") and a gate 637. In FIG. 6, the semiconductor structures 637 are fins. In other embodiments, the semiconductor structures 637 are other types of semiconductor structures, such as nanoribbon, nanowire, and so on. An embodiment of the transistor 630 is the FinFET 100 in FIG. 1. In other embodiments, the transistor 630 may be a nanoribbon transistor (e.g., the nanoribbon FET 200 in FIG. 2) or a nanosheet transistor (e.g., the nanowire FET 300 in FIG. 3). A BPR 610 or 615 and its corresponding TSV 670 or 675 may constitute an ESD ballasting resistor for the corresponding transistor 630. The resistance of a combination of the BPR 610 or 615 and its corresponding TSV 670 can be above 5 ohm to provide effective ESD protection. In some embodiments, the combined resistance of the BPR and TSV is less than 20 ohms to provide efficient power delivery and avoid overheating the IC structure 600. The electrically conductive layers 640 and 650 are on top of the transistors 630. In some embodiments, the electrically conductive layers 640 and 650 are used for signal delivery.

Figure 7:
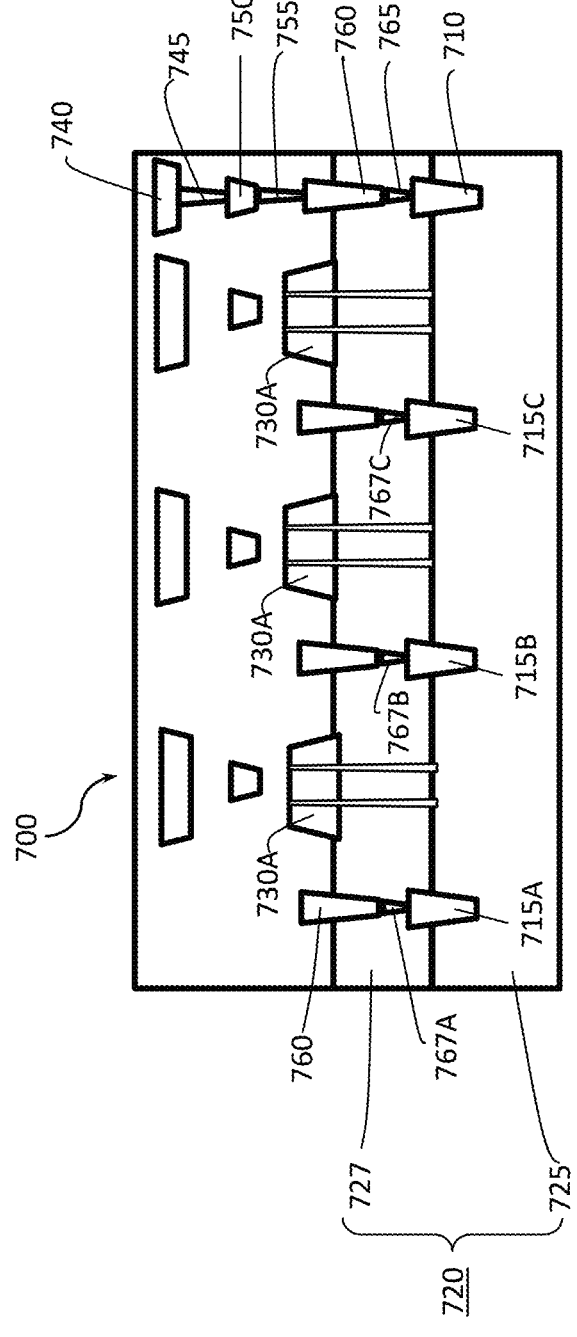
FIG. 7 is a cross-sectional view of an example IC structure including more than two BPRs for front-side power delivery and ESD ballasting, according to some embodiments of the disclosure.

FIG. 7 is a cross-sectional view of an example IC structure 700 including more than two BPRs for front-side power delivery and ESD ballasting, according to some embodiments of the disclosure. The IC structure 700 includes four BPRs 710 and 715A-C, a support structure 720, transistors 730A-C (individually referred to as "transistor 730"), electrically conductive layers 740, 750, and 760, and vias 745, 755, 765, and 767A-C. An electrically conductive layer is a layer including an electrically conductive material, such as metal. In other embodiments, the IC structure 700 may include fewer, more, or different components.

The BPRs 710 and 715A-C in FIG. 7 are used for both power delivery and for protecting the transistors 730A-C from ESD stress. The BPRs 710 and 715A-C are buried in the support structure 720. The support structure 720 may be the same or similar to the support structure 420 in FIGS. 4 and 5. The support structure 720 includes a semiconductor layer 725 and an insulator layer 727. The BPRs 710 and 715A-C are coupled to the electrically conductive layers 740, 750, and 760 through the vias 745, 755, 765, and 767A-C. For instance, the BPR 710 is coupled to the electrically conductive layer 760 through the via 765. The BPRs 715A-C are coupled to the electrically conductive layer 760 through the vias 767A-C, respectively. Even though not shown in FIG. 7, the electrically conductive layer 760 is connected to the transistors 730. In some embodiments, the electrically conductive layer 740 may be a power plane. The electrically conductive layer 750 may be used to deliver signals to components of the IC structure 700, such as the transistors 730. The electrically conductive layer 760 may be a ground plane. That forms a conducting path for backside power delivery.

In the embodiment of FIG. 7, the BPR 715A and the via 767A forms an ESD ballasting resistor for the transistor 730A. The BPR 715A and via 767A are in the flow path of an electrical current flowing through the transistor 730A to protect the transistor 730A from ESD. Similarly, the BPR 715B and the via 767B, which are between the transistors 730A and 730B, forms an ESD ballasting resistor for the transistor 730B and the BPR 715C and the via 767C, which are between the transistors 730C and 730C, forms an ESD ballasting resistor for the transistor 730C. The resistance of the ESD ballasting resistor for a transistor 730 is in a range from 5 to 20 ohm. In an embodiment, the BPRs 715A-C are coupled to the drain regions of the transistors 730A-C. The BPRs 715A-C may be arranged as a meander structure. More details about the meander structure are described below in conjunction with FIG. 9.

Figure 8:
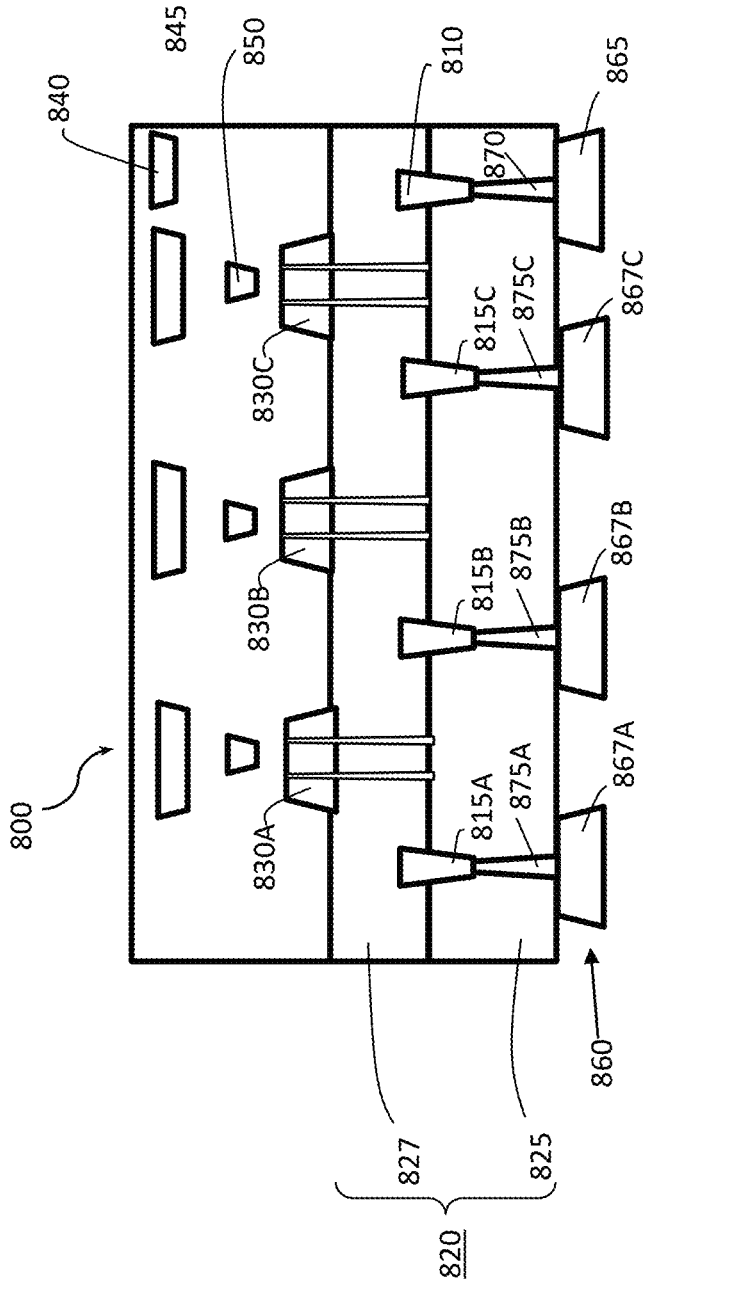
FIG. 8 is a cross-sectional view of an example IC structure including more than two BPRs for backside power delivery and ESD ballasting, according to some embodiments of the disclosure.

FIG. 8 is a cross-sectional view of an example IC structure 800 including more than two BPRs for backside power delivery and ESD ballasting, according to some embodiments of the disclosure. The IC structure 800 includes four BPRs 810 and 815A-C, a support structure 820, transistors 830A-C (individually referred to as "transistor 830"), electrically conductive layers 840, 850, and 860, and TSVs 870 and 875A-C. An electrically conductive layer is a layer including an electrically conductive material, such as metal. In other embodiments, the IC structure 800 may include fewer, more, or different components. For instance, the IC structure 800 may include vias that connects some of the components of the IC structure 800.

The BPRs 810 and 815A-C in FIG. 8 are used for both power delivery and for protecting the transistors 830A-C from ESD stress. The BPRs 810 and 815A-C are buried in the support structure 820. The support structure 820 may be the same or similar to the support structure 420 in FIGS. 4 and 5. The support structure 820 includes a semiconductor layer 825 and an insulator layer 827. The BPRs 810 and 815A-C and the electrically conductive layer 860 constitute backside power delivery for the IC structure 800. The BPRs 810 and 815A-C are connected to different sections of the electrically conductive layer 860 through the TSVs 870 and 875A-C. In FIG. 8, the BPR 810 is connected to the TSV 870, which is connected to the section 865 of the electrically conductive layer 860. The BPRs 815A-C are connected to the other sections 867A-C of the electrically conductive layer through the TSVs 875A-C, respectively. For instance, the BPR 810 is coupled to the electrically conductive layer 860 through the TSV 870. The BPRs 815A-C are coupled to the electrically conductive layer 860 through the TSVs 875A-C, respectively. The different sections 865 and 867A-C of the electrically conductive layer 860 are insulated from each other. In an embodiment, the section 865 of the electrically conductive layer 860 is the power plane and the other sections 867A-C of the electrically conductive layer 860 are the ground plane. Even though not shown in FIG. 8, the electrically conductive layer 860 is coupled to the transistors 830 for delivering power to the transistors 830.

The BPRs 815A-C are also used for ESD ballasting. The BPR 815A and the TSV 875A forms an ESD ballasting resistor for the transistor 830A. The BPR 815A and TSV 875A are in the flow path of an electrical current flowing through the transistor 830A to protect the transistor 830A from ESD stress. Similarly, the BPR 815B and the TSV 875B, which are between two adjacent transistors 830A and 830B, forms an ESD ballasting resistor for one or both of the transistors 830A and 830B. The BPR 815C and the TSV 875C, which are between two adjacent transistors 830C and 830C, forms an ESD ballasting resistor for one or both of the transistors 830B and 830C. The resistance of the ESD ballasting resistor for a transistor 830 is in a range from 5 to 20 ohm. In an embodiment, the BPRs 815A-C are coupled to the drain regions of the transistors 830A-C. The BPRs 815A-C may be arranged as a meander structure. The TSVs 870 and 875A-C may be micro-TSVs or nano-TSVs.

In some of the embodiments of FIGS. 7 and 8, a BPR and its corresponding via or TSV (i.e., the via or TSV connected to the BPR) function as the ESD ballasting resistor of one transistor to ensure uniform current distribution among all the semiconductor structures of the transistor. Some of the BPRs in FIGS. 7 and 8 are arranged between the transistors in the IC structure. In other embodiments, a BPR may be arranged between semiconductor structures (e.g., fins) of the same transistor.

Figure 9:
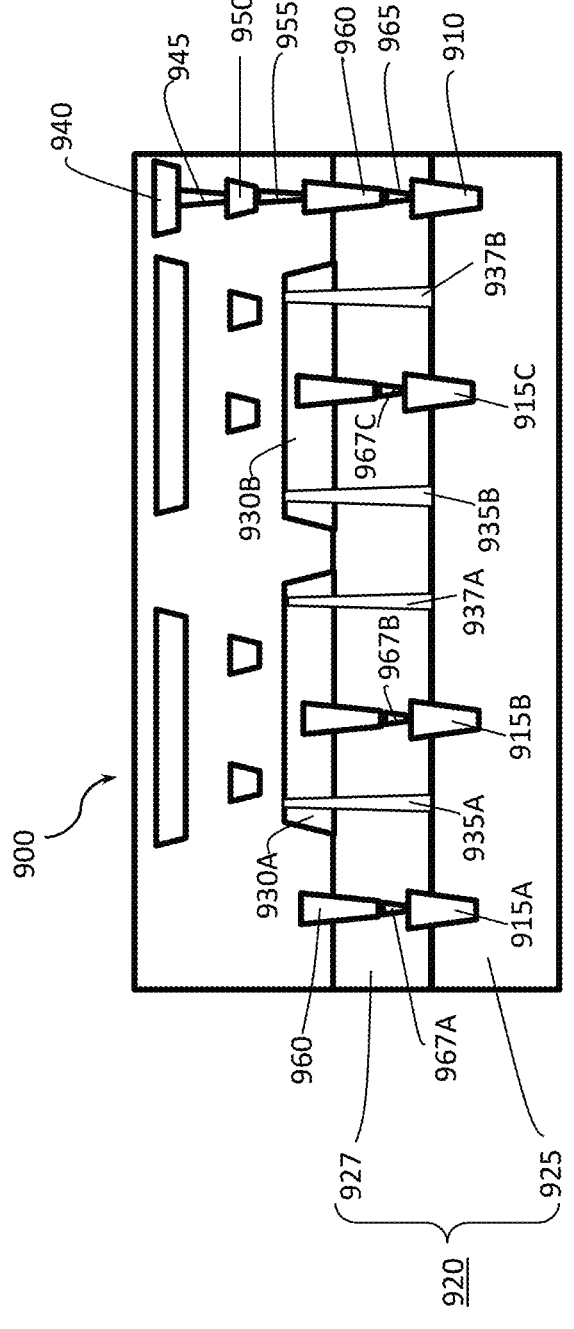
FIG. 9 is a cross-sectional view of another example IC structure including more than two BPRs for front-side power delivery and ESD ballasting, according to some embodiments of the disclosure.

FIG. 9 is a cross-sectional view of another example IC structure 900 including more than two BPRs for front-side power delivery and ESD ballasting, according to some embodiments of the disclosure. The IC structure 900 includes four BPRs 910 and 915A-C, a support structure 920, transistors 930A-B (individually referred to as "transistor 930"), electrically conductive layers 940, 950, and 960, and vias 945, 955, 965, and 967A-C. An electrically conductive layer is a layer including an electrically conductive material, such as metal. In other embodiments, the IC structure 900 may include fewer, more, or different components.

The BPRs 910 and 915A-C in FIG. 9 are used for both power delivery and for protecting the transistors 930A-C from ESD stress. The BPRs 910 and 915A-C are buried in the support structure 920. The support structure 920 may be the same or similar to the support structure 420 in FIGS. 4 and 5. The support structure 920 includes a semiconductor layer 925 and an insulator layer 927. The BPRs 910 and 915A-C are connected to the electrically conductive layers 940, 950, and 960 through the vias 945, 955, 965, and 967A-C. For instance, the BPR 910 is coupled to the electrically conductive layer 960 through the via 965. The BPRs 915A-C are coupled to the electrically conductive layer 960 through the vias 967A-C, respectively. Even though not shown in FIG. 9, the electrically conductive layer 960 is connected to the transistors 930. In some embodiments, the electrically conductive layer 940 may be a power plane. The electrically conductive layer 950 may be used to deliver signals to components of the IC structure 900, such as the transistors 930. The electrically conductive layer 960 may be a ground plane. That forms a conducting path for backside power delivery.

In the embodiment of FIG. 9, the BPR 915B and the via 967B forms an ESD ballasting resistor for the transistor 930A. The BPR 915B and via 967B are arranged between semiconductor structures 935A and 937A of the transistor 930A. The BPR 915B and via 967B are in the flow path of an electrical current flowing through the transistor 930A to protect the transistor 930A from ESD. Similarly, the BPR 915C and the via 967C, which are between the semiconductor structures 935B and 937B of the transistor 930B, forms an ESD ballasting resistor for the transistor 930B. The resistance of the ESD ballasting resistor for a transistor 930 is in a range from 5 to 20 ohm. In an embodiment, the BPRs 915A-C are coupled to the drain regions of the transistors 930A-C.

Figure 10:
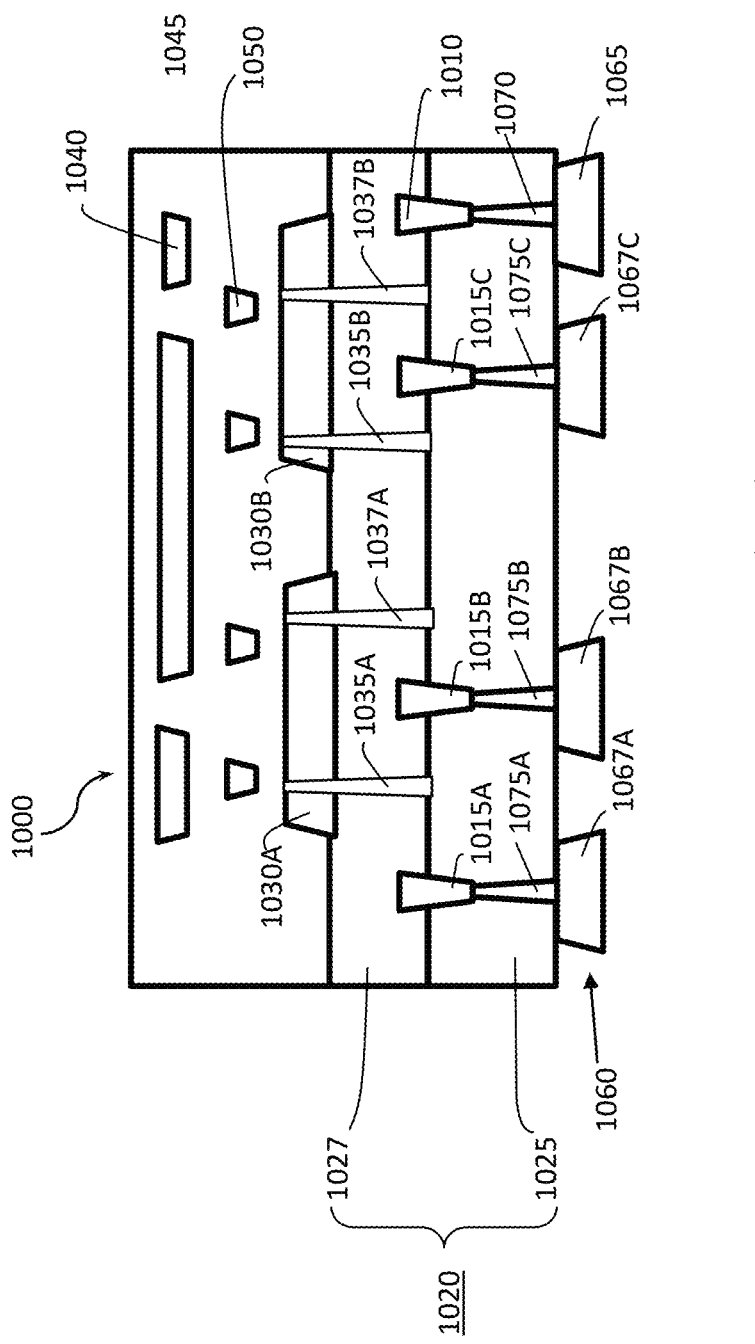
FIG. 10 is a cross-sectional view of another example IC structure including more than two BPRs for backside power delivery and ESD ballasting, according to some embodiments of the disclosure.

FIG. 10 is a cross-sectional view of another example IC structure 1000 including more than two BPRs for backside power delivery and ESD ballasting, according to some embodiments of the disclosure. The IC structure 1000 includes four BPRs 1010 and 1015A-C, a support structure 1020, transistors 1030A-B (individually referred to as "transistor 1030"), electrically conductive layers 1040, 1050, and 1060, and TSVs 1070 and 1075A-C. An electrically conductive layer is a layer including an electrically conductive material, such as metal. In other embodiments, the IC structure 1000 may include fewer, more, or different components. For instance, the IC structure 1000 may include vias that connects some of the components of the IC structure 1000.

The BPRs 1010 and 1015A-C in FIG. 10 are used for both power delivery and for protecting the transistors 1030A-B from ESD stress. The BPRs 1010 and 1015A-C are buried in the support structure 920. The support structure 920 may be the same or similar to the support structure 420 in FIGS. 4 and 5. The BPRs 1010 and 1015A-C and the electrically conductive layer 1060 constitute backside power delivery for the IC structure 1000. The BPRs 1010 and 1015A-C are coupled to different sections of the electrically conductive layer 1060 through the TSVs 1070 and 1075A-C. In FIG. 10, the BPR 1010 is connected to the TSV 1070, which is connected to the section 1065 of the electrically conductive layer 1060. The BPRs 1015A-C are coupled to the other sections 1067A-C of the electrically conductive layer through the TSVs 1075A-C, respectively. For instance, the BPR 1010 is coupled to the electrically conductive layer 1060 through the TSV 1070. The BPRs 1015A-C are coupled to the electrically conductive layer 1060 through the TSVs 1075A-C, respectively. The different sections 1065 and 1067A-C of the electrically conductive layer 1060 are insulated from each other. In an embodiment, the section 1065 of the electrically conductive layer 1060 is the power plane and the other sections 1067A-C of the electrically conductive layer 1060 are the ground plane. Even though not shown in FIG. 10, the electrically conductive layer 1060 is coupled to the transistors 1030 for delivering power to the transistors 1030.

The BPRs 1015A-C are also used for ESD ballasting. In one example, the BPR 1015B and the TSV 1075B forms an ESD ballasting resistor for the transistor 1030A. The BPR

1015B and the TSV 1067B are arranged between the semiconductor structures 1035A and 1037A of the transistor 1030A. The BPR 1015B and TSV 1075B are in the flow path of an electrical current flowing through the transistor 1030A to protect the transistor 1030A from ESD. Similarly, the BPR 1015C and the TSV 1075C, which are between the semiconductor structures 1035B and 1037B of the transistor 1030B, forms an ESD ballasting resistor for the transistor 1030B. The resistance of the ESD ballasting resistor for a transistor 1030 is in a range from 5 to 20 ohm. In an embodiment, the BPRs 1015B-C are coupled to the drain regions of the transistors 1030A-B.

For simplicity and illustration, FIGS. 9 and 10 shows BPRs arranged between two adjacent semiconductor structures. In some embodiments, an ESD ballasting resistor based on such a BPR can be used for protecting a semiconductor structure of a transistor from ESD stress. In other embodiments, a BPR can be arranged between two stacks of semiconductor structures. An ESD ballasting resistor based on such a BPR can be used for protecting a stack of semiconductor structures from ESD stress.

Figure 11:
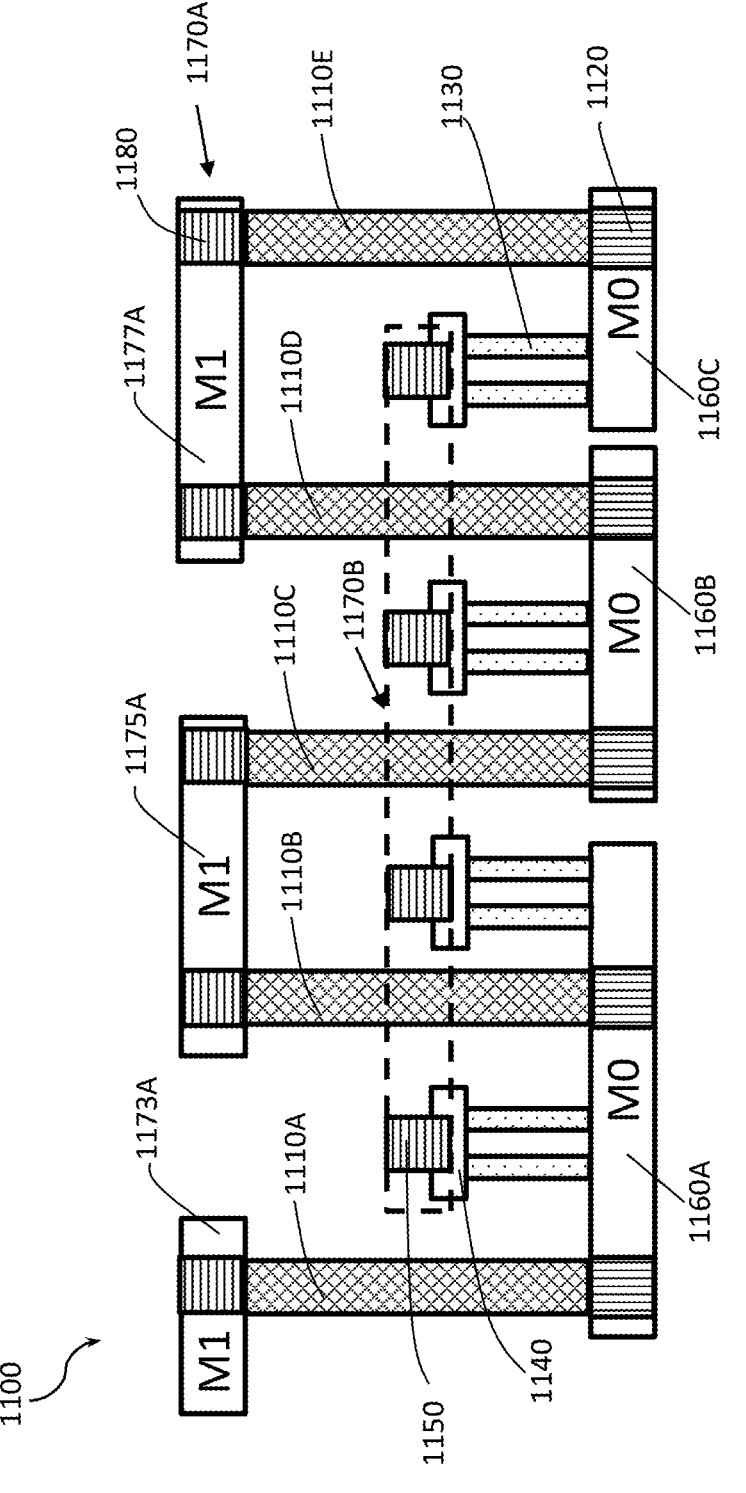
FIG. 11 is a top view of an example IC structure including a meander structure, according to some embodiments of the disclosure.

FIG. 11 is a top view of an example IC structure 1100 including BPRs 1110 forming a meander structure, according to some embodiments of the disclosure. The IC structure 1100 includes five BPRs 1110A-E (collectively referred to as "BPRs 1110" or "BPR 1110"), semiconductor structures 1130 (individually referred to as "semiconductor structure 1130") of transistors, gates 1140 (individually referred to as "gate 1140") of the transistors, electrically conductive layers M0 and M1, vias 1120 (individually referred to as "via 1120") that connect the BPRs 1110 to the electrically conductive layer M0, vias 1150 (individually referred to as "via 1150") that connect the gates 1140 to the electrically conductive layer M1, and vias 1180 individually referred to as "via 1180") that connect the BPRs 1110 to the electrically conductive layer M1. The electrically conductive layer M0 includes sections 1160A-C. The electrically conductive layer M1 includes a section 1170A and a section 1170B. The section 1170A of the electrically conductive layer M1 includes three sections 1173A, 1175A, and 1177A. In other embodiments, the IC structure 1100 may include fewer, more, or different components. For instance, the semiconductor structures 1130 in FIG. 11 are fins. However, in other embodiments, the semiconductor structures 1130 may be nanowires or nanoribbons.

The BPRs 1110 and vias 1120 constitute ESD ballasting resistors for the drain regions of the transistors. In the embodiment of FIG. 11, M1 and M0 are two electrically conductive layers to provide power to the transistors. For instance, M1 is the power plane and M0 is the ground plane. The drain regions of the transistors are coupled to the section 1170A of M1 but the source regions of the transistors are coupled to the section 1170B of M1. For the source region of a transistor, the power delivery path includes the section 1170B of M1, a via 1150, semiconductor structures 1130, and M0. In contrast, for the drain region of a transistor, the power delivery path includes the section 1170A of M1, a BPR 1110, a via 1120 connected to the BPR 1110, semiconductor structures 1130, and M0. Thus, compared with the source region, the power delivery path for the drain region includes additional components, i.e., the BPR 1110 and the via 1120. The BPR 1110 and via 1120 increases the resistance in the power delivery path for the drain region. The increased resistance can protect the transistor from ESD stress. Thus, the BPR 1110 and via 1120 function as an ESD ballasting resistor. In some embodiments, the increased resistance is in a range from 5 to 20 ohms.

The BPRs 1110, electrically conductive layer M0, the section 1170A of the electrically conductive layer M1, and vias 1120 and 1180 form the meander structure. In the meander structure, the vias 1120 connects the bottom ends of the BPRs 1110 to the electrically conductive layer M0 and the vias 1180 connects the top ends of the BPRs 1110 to the section 1170A of the electrically conductive layer M1. A BPR 1110 may be between two adjacent transistors, meaning two transistors that are next to each other in the IC structure 1100. For instance, each of the BPRs 1110B-D is between two adjacent transistors. As shown in FIG. 11, the meander structure, from left to right, includes the section 1173A of the electrically conductive layer M1, the BPR 1110A, the section 1160A of the electrically conductive layer M0, the BPR 1110B, the section 1175A of the electrically conductive layer M1, followed by the BPR 1110C, the section 1160B of the electrically conductive layer M0, the BPR 1110D, the section 1177A of the electrically conductive layer M1, and the BPR 1110E, as well as all the vias 1120 and 1180 in between. The meander structure in the IC structure 1100 allows placements of multiple BPRs 1110 and vias 1120 in the limited spaced of the IC structure 1100, which increases the overall resistance for ESD ballasting. FIG. 11 shows fives BPRs 1110. In other embodiments, the meander structure may include a different number of BPRs 1110.

Figure 12:
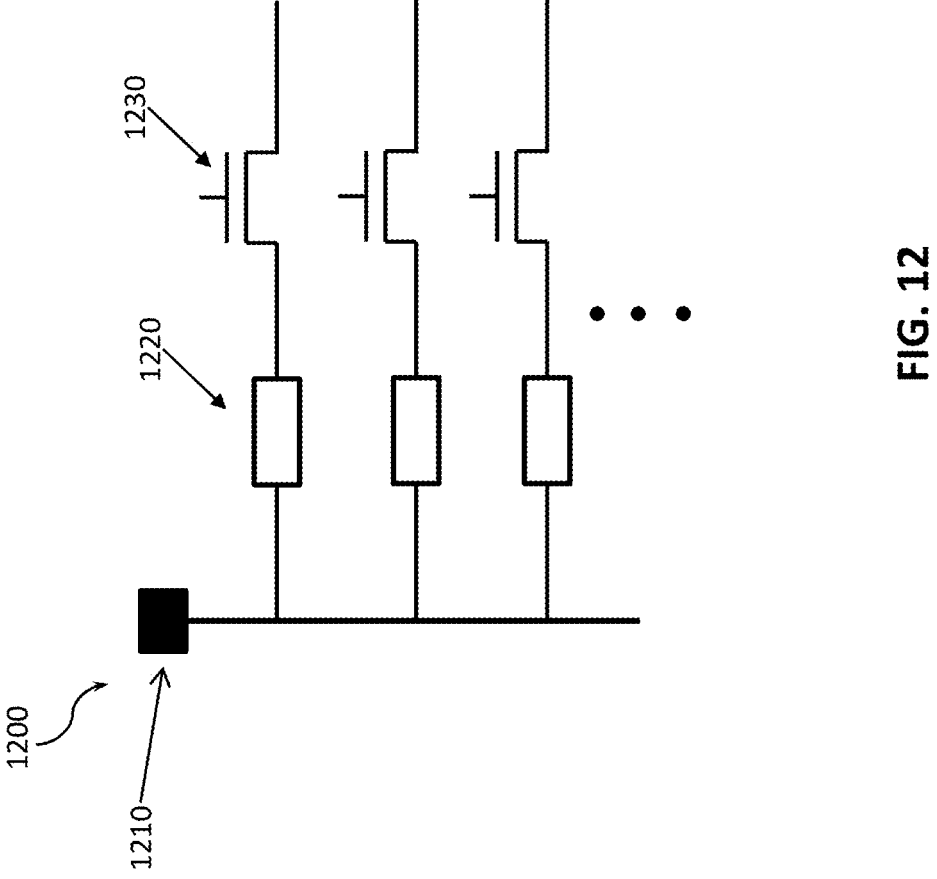
FIG. 12 is a schematic diagram of an electrical circuit including transistors and ballasting resistors, according to some embodiments of the disclosure.

FIG. 12 is a schematic diagram of an electrical circuit 1200 including transistors 1230 and ESD ballasting resistors 1220, according to some embodiments of the disclosure. The electrical circuit 1200 may be a part of the circuit in the IC structure 700, 800, 900, or 1000 described above. In FIG. 12, the transistors 1230 are connected to a power source 1210 that provides power to the transistors 1230. The transistors 1230 are arrange in parallel to each other. Each transistor 1230 is coupled with an ESD ballasting resistor 1220 that protects the transistor 1230 from ESD stress. In an embodiment, the ESD ballasting resistor 1220 includes a BPR and a via connected to the BPR. In another embodiment, the ESD ballasting resistor 1220 includes a BPR and a TSV connected to the BPR. The resistance of each ESD ballasting resistor 1220 can be 5 to 20 ohms.

Figures 13A, 13B:
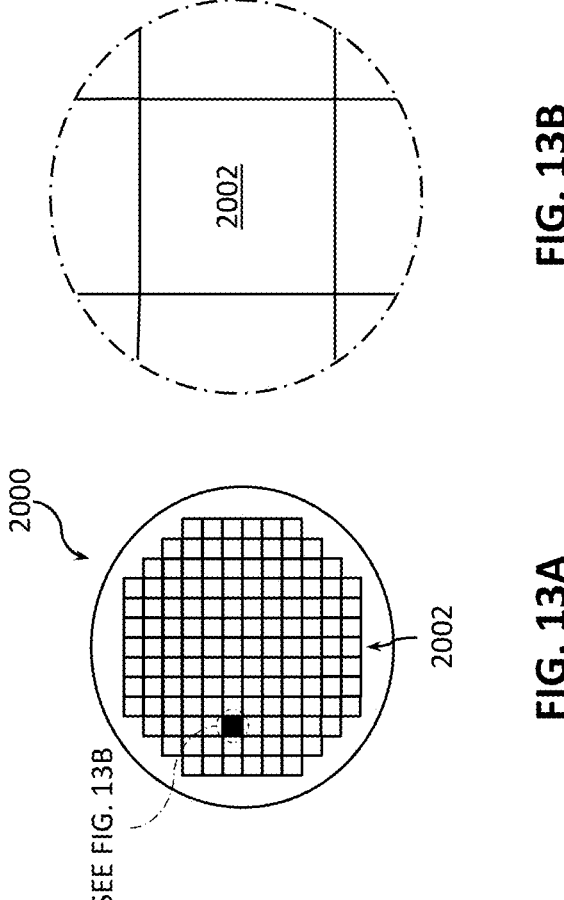
FIGS. 13A and 13B are top views of, respectively, a wafer and dies that may include one or more BPRs, according to some embodiments of the disclosure.

FIGS. 13A-13B are top views, respectively, of a wafer 2000 and dies 2002 that may include one or more BPRs, according to some embodiments of the disclosure. In some embodiments, the dies 2002 may be included in an IC package, in accordance with any of the embodiments disclosed herein. For example, any of the dies 2002 may serve as any of the dies 2256 in an IC package 2200 shown in FIG. 14. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more BPRs as described herein). After the fabrication of the semiconductor product is complete (e.g., after manufacture of one or more BPRs as described herein), the wafer 2000 may undergo a singulation process in which each of the dies 2002 is separated from one another to provide discrete "chips" of the semiconductor product. In particular, devices that include one or more BPRs as disclosed herein may take the form of the wafer 2000 (e.g., not singulated) or the form of the die 2002 (e.g., singulated). The die 2002 may include one or more diodes (e.g., one or more BPRs as described herein), one or more transistors (e.g., one or more III-N transistors as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an ESD protection device, a radio frequency (RF) FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 14:
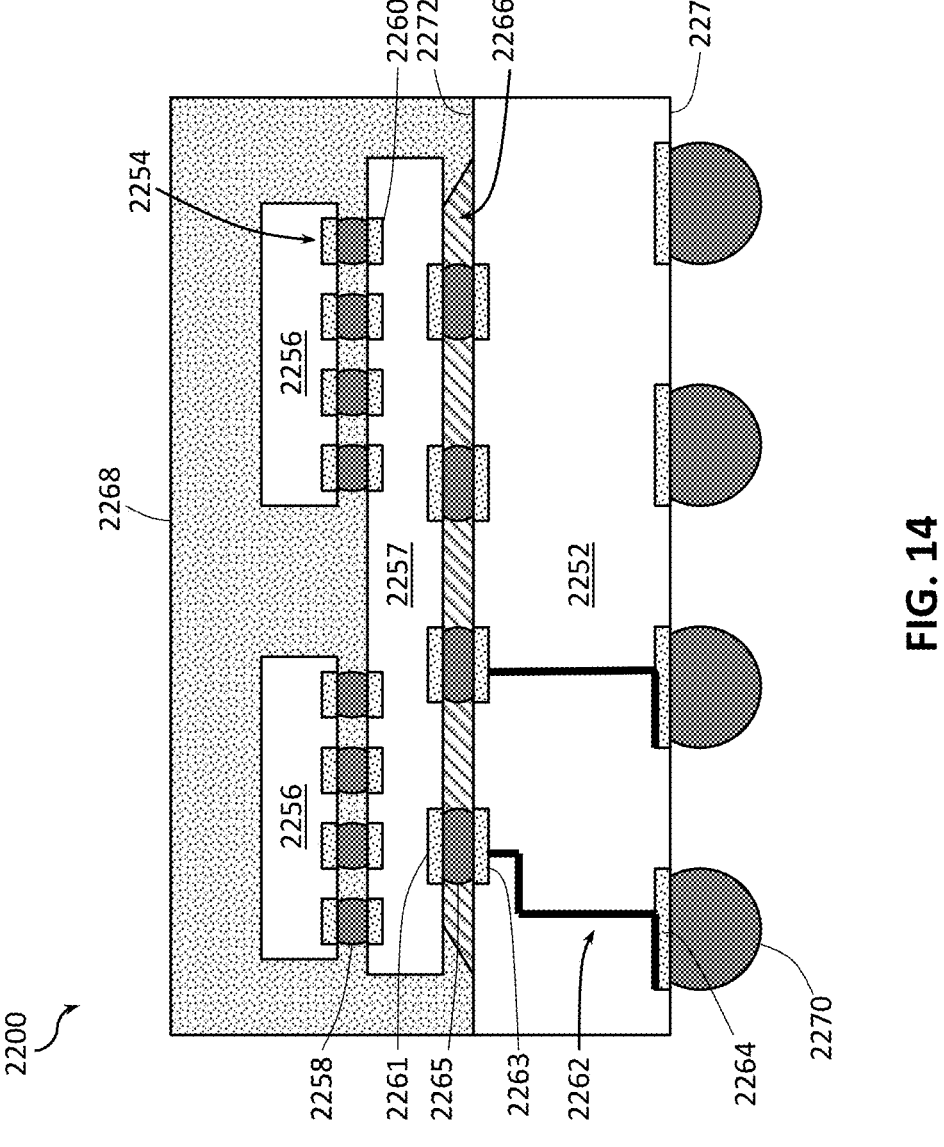
FIG. 14 is a cross-sectional view of an example IC package that may include one or more BPRs, according to some embodiments of the disclosure.

FIG. 14 is a cross-sectional view of an example IC package 2200 that may include one or more BPRs, according to some embodiments of the disclosure. In some embodiments, the IC package 2200 may be a system-in-package (SiP). As shown in FIG. 14, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 14 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 14 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 14 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 15.

The dies 2256 may take the form of any of the embodiments of the die 2002 discussed herein and may include any of the embodiments of an IC device having one or more BPRs. In embodiments in which the IC package 2200 includes multiple dies 2256, the IC package 2200 may be referred to as a multi-chip package (MCP). Importantly, even in such embodiments of an MCP implementation of the IC package 2200, one or more BPRs may be provided in a single chip, in accordance with any of the embodiments described herein. The dies 2256 may include circuitry to perform any desired functionality. For example, one or more of the dies 2256 may be ESD protection dies, including one or more BPRs as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more BPRs, e.g., as discussed above; in some embodiments, at least some of the dies 2256 may not include any III-N diodes with n-doped wells and capping layers.

The IC package 2200 illustrated in FIG. 14 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 14, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 15:
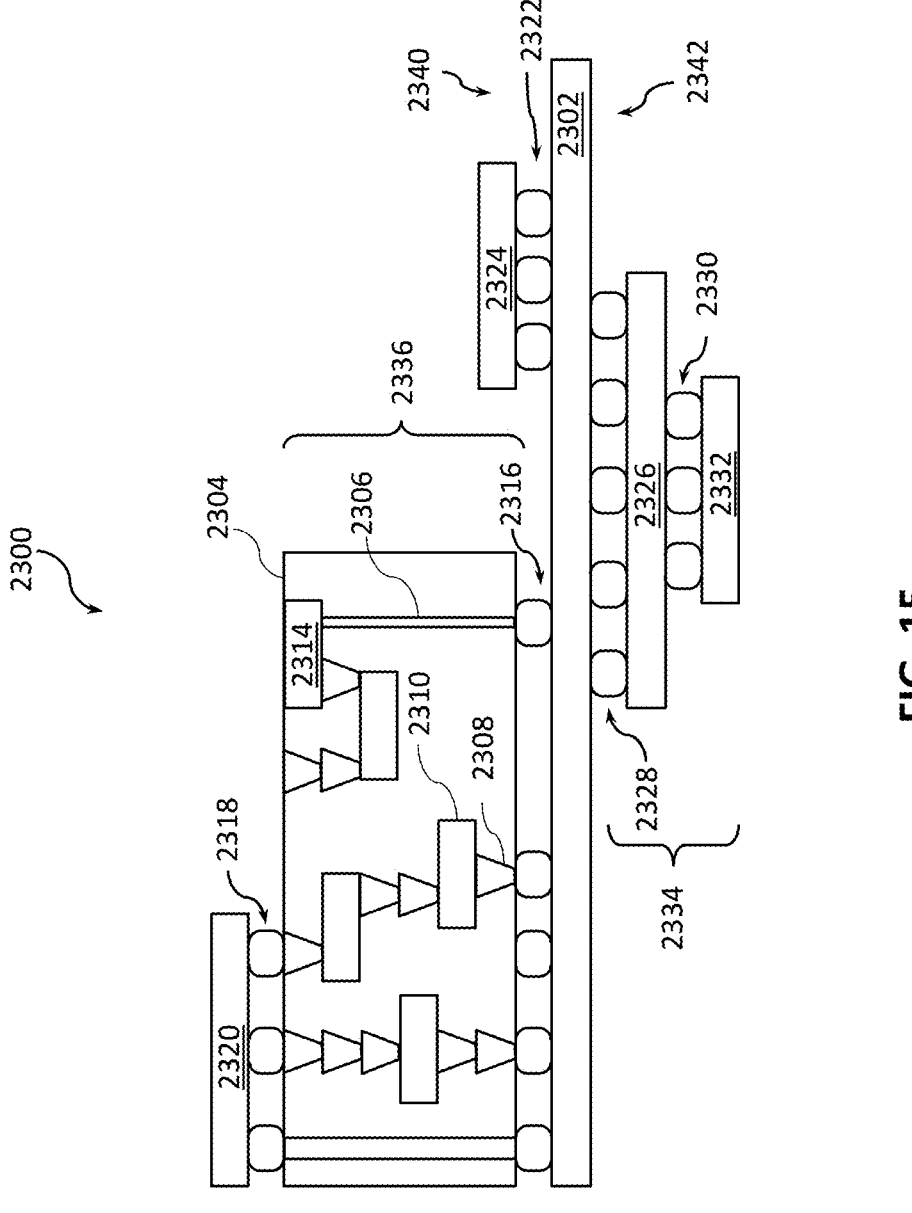
FIG. 15 is a cross-sectional view of an example IC device assembly that may include one or more BPRs, according to some embodiments of the disclosure.

FIG. 15 is a cross-sectional view of an example IC device assembly 2300 that may include one or more BPRs, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more BPRs in accordance with any of the embodiments disclosed herein; e.g., any of the IC packages discussed below with reference to the IC device assembly 2300 may take the form of any of the embodiments of the IC package 2200 discussed above with reference to FIG. 14 (e.g., may include one or more BPRs in/on a die 2256).

In some embodiments, the circuit board 2302 may be a printed circuit board (PCB) including multiple electrically conductive layers separated from one another by layers of dielectric material and interconnected by electrically conductive vias. Any one or more of the electrically conductive layers may be formed in a desired circuit pattern to route electrical signals (optionally in conjunction with other electrically conductive layers) between the components coupled to the circuit board 2302. In other embodiments, the circuit board 2302 may be a non-PCB substrate.

The IC device assembly 2300 illustrated in FIG. 15 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 15), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 13B), an IC device (e.g., the IC structure of FIGS. 4-11), or any other suitable component. In particular, the IC package 2320 may include one or more BPRs as described herein. Although a single IC package 2320 is shown in FIG. 15, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 15, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more BPRs as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 15 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 16:
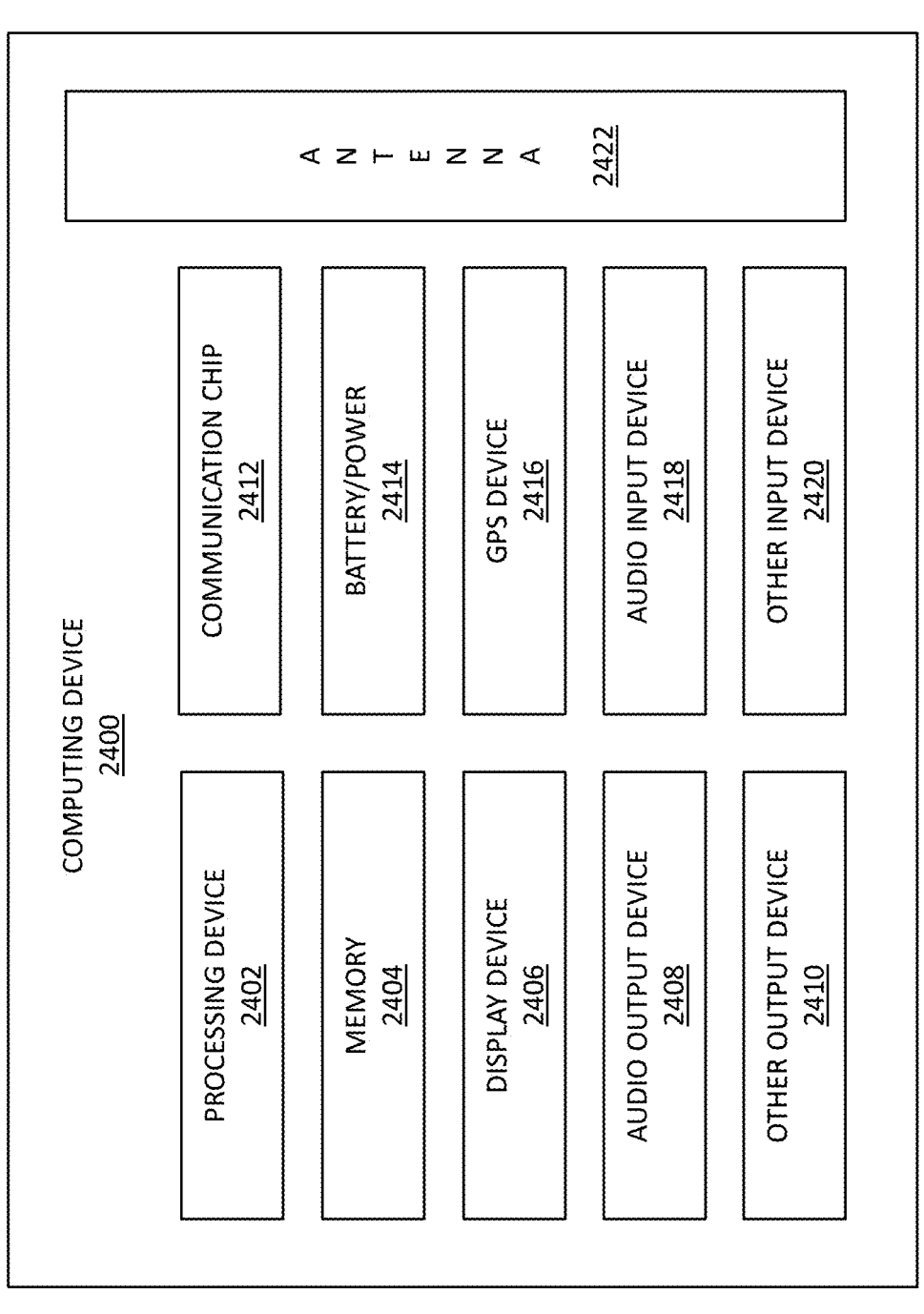
FIG. 16 is a block diagram of an example computing device that may include one or more components having one or more BPRs, according to some embodiments of the disclosure.

FIG. 16 is a block diagram of an example computing device 2400 that may include one or more components having one or more BPRs, according to some embodiments of the disclosure. For example, any suitable ones of the components of the computing device 2400 may include a die (e.g., the die 2002 of FIG. 13B) including one or more BPRs in accordance with any of the embodiments disclosed herein. Any of the components of the computing device 2400 may include an IC device (e.g., any embodiment of the IC devices of FIGS. 4-11) and/or an IC package (e.g., the IC package 2200 of FIG. 14). Any of the components of the computing device 2400 may include an IC device assembly (e.g., the IC device assembly 2300 of FIG. 15).

A number of components are illustrated in FIG. 16 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-chip (SoC) die.

Additionally, in various embodiments, the computing device 2400 may not include one or more of the components illustrated in FIG. 16, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices having one or more BPRs as described herein may be particularly advantageous for use as part of ESD circuits protecting power amplifiers, low-noise amplifiers, filters (including arrays of filters and filter banks), switches, or other active components. In some embodiments, IC devices having one or more BPRs as described herein may be used in PMICs, e.g., as a rectifying diode for large currents. In some embodiments, IC devices having one or more BPRs as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

Example 1 provides an IC structure, including: a plurality of transistors, an individual transistor of the plurality of transistors including a source region and a drain region; a first layer including a first electrically conductive material, the first layer coupled to the plurality of transistors; a second layer including a second electrically conductive material; and a sequence of power rails including three or more power rails, the sequence of power rails coupled to the first layer by a sequence of first vias and coupled to the second layer by a sequence of second vias, where: an individual power rail in the sequence of power rails is coupled to the drain region of the individual transistor by an individual first via of the sequence of first vias, and the individual power rail is coupled to the source region of the individual transistor through an individual second via in the sequence of second vias.

Example 2 provides the IC structure according to example 1, where the first layer is between the second layer and the sequence of power rails.

Example 3 provides the IC structure according to example 1 or 2, where: the first layer includes a first section, a second section, and a first gap between the first section and second sections; the second layer includes a third section, a fourth section, and a second gap between the third section and fourth sections; a first power rail of the sequence of power rails includes a first end coupled to the first section of the first layer and a second end connected to the third section of the second layer; a second power rail of the sequence of power rails includes a third end connected to the third section of the second layer and a fourth end connected to the second section of the first layer; and the first power rail is adjacent to the second power rail in the sequence of power rails.

Example 4 provides the IC structure according to any of the preceding claims, where a resistance of a combination of the individual power rail and individual first via is at least 5 ohm.

Example 5 provides the IC structure according to any of the preceding claims, further including a support structure including a layer, where the layer includes a semiconductor material and the sequence of power rails is buried in the support structure.

Example 6 provides the IC structure according to example 5, where: the support structure further includes an additional layer; the additional layer includes an electrically insulation material; a first portion of the individual power rail is in the layer; and a second portion of the individual power rail is in the additional layer.

Example 7 provides the IC structure according to any of the preceding claims, where the individual transistor includes: a first and a second semiconductor structures; and a gate having a first portion at least partially wrapping around a portion of the first semiconductor structure and having a second portion at least partially wrapping around a portion of the second semiconductor structure.

Example 8 provides the IC structure according to example 7, where the first or second semiconductor structure includes a fin, nanoribbon, or nanowire of a semiconductor material.

Example 9 provides the IC structure according to example 7 or 8, where the individual power rail is between the first and second semiconductor structures of the individual transistor.

Example 10 provides the IC structure according to any of the preceding claims, where the individual power rail is between two adjacent transistors of the plurality of transistors.

Example 11 provides an IC structure, including: a first and a second semiconductor structures of one or more transistors; a layer including an electrically conductive material, the layer coupled to the first and second semiconductor structures; and a sequence of power rails including three or more power rails, where at least one power rail in the sequence is coupled to the layer by a via.

Example 12 provides the IC structure according to example 11, where the first and second semiconductor structures are between the layer and the sequence of power rails.

Example 13 provides the IC structure according to example 11 or 12, where a resistance of a combination of a power rail in the sequence and the via is in a range from 5 ohm to 20 ohm.

Example 14 provides the IC structure according to any of the examples 11-13, where a power rail in the sequence is between the first and second semiconductor structures.

Example 15 provides the IC structure according to any of the examples 11-14, further including a support substrate, where the sequence of power rails is buried in the support structure.

Example 16 provides the IC structure according to example 15, where the support structure includes an additional layer including a semiconductor material, and at least a portion of the first or second semiconductor structure is in the additional layer.

Example 17 provides the IC structure according to any of the examples 11-16, where the first or second semiconductor structure includes a fin, nanoribbon, or nanowire of a semiconductor material.

Example 18 provides an IC structure, including: a plurality of semiconductor structures of one or more transistors; a first layer including a first electrically conductive material, the layer coupled to the plurality of semiconductor structures; a second layer including a second electrically conductive material; and a sequence of power rails including three or more power rails, where a first power rail in the sequence is coupled to the first layer by a via, and a second power rail in the sequence is coupled to the second layer by a through-substrate via.

Example 19 provides the IC structure according to example 18, further including a support structure between the first layer and second layer, where the sequence of power rails and the through-substrate via are in the support structure.

Example 20 provides the IC structure according to example 18 or 19, where the second layer is a power or ground plane.

Example 21 provides an IC package, including the IC structure according to any of the proceeding examples; and a further IC component, coupled to the IC structure.

Example 22 provides the IC package according to example 21, where the further IC component includes one of a package substrate, an interposer, or a further IC die.

Example 23 provides the IC package according to example 21 or 22, where the IC structure according to any one of examples 1-20 may include, or be a part of, at least one of a memory device, a computing device, a wearable device, a handheld electronic device, and a wireless communications device.

Example 24 provides a n electronic device, including a carrier substrate; and one or more of the IC structures according to any one of examples 1-20 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
   a plurality of transistors, an individual transistor of the plurality of transistors comprising a source region and a drain region;
   a first layer comprising a first electrically conductive material, the first layer coupled to the plurality of transistors;
   a second layer comprising a second electrically conductive material;
   a support structure comprising a layer and an additional layer, the layer comprising a semiconductor material, the additional layer comprising an electrically insulation material; and a sequence of power rails buried in the support structure, the sequence of power rails comprising three or more power rails, the sequence of power rails coupled to the first layer by a sequence of first vias and coupled to the second layer by a sequence of second vias, wherein:

an individual power rail in the sequence of power rails is coupled to the drain region of the individual transistor by an individual first via of the sequence of first vias, the individual power rail is coupled to the source region of the individual transistor through an individual second via in the sequence of second vias, a first portion of the individual power rail is in the layer, and a second portion of the individual power rail is in the additional layer.

2. The IC structure according to claim 1, wherein the first layer is between the second layer and the sequence of power rails.

3. The IC structure according to claim 1, wherein:

the first layer comprises a first section, a second section, and a first gap between the first section and second sections;

the second layer comprises a third section, a fourth section, and a second gap between the third section and fourth sections;

a first power rail of the sequence of power rails comprises a first end coupled to the first section of the first layer and a second end connected to the third section of the second layer;

a second power rail of the sequence of power rails comprises a third end connected to the third section of the second layer and a fourth end connected to the second section of the first layer; and the first power rail is adjacent to the second power rail in the sequence of power rails.

4. The IC structure according to claim 1, wherein a resistance of a combination of the individual power rail and individual first via is at least 5 ohm.

5. The IC structure according to claim 1, wherein the individual transistor comprises:

a first and a second semiconductor structures; and a gate having a first portion at least partially wrapping around a portion of the first semiconductor structure and having a second portion at least partially wrapping around a portion of the second semiconductor structure.

6. The IC structure according to claim 5, wherein the first or second semiconductor structure comprises a fin, nanoribbon, or nanowire of a semiconductor material.

7. The IC structure according to claim 5, wherein the individual power rail is between the first and second semiconductor structures of the individual transistor.

8. The IC structure according to claim 1, wherein the individual power rail is between two adjacent transistors of the plurality of transistors.

9. An integrated circuit (IC) structure, comprising:

a first semiconductor structures of one or more transistors;

a second semiconductor structure of the one or more transistors;

a layer comprising an electrically conductive material, the layer coupled to the first semiconductor structure and the second semiconductor structure;

a support structure comprising a first layer and a second layer, the first layer comprising a semiconductor material, the second layer comprising an electrically insulation material; and a sequence of power rails buried in the support structure, the sequence of power rails comprising three or more power rails, wherein an individual power rail in the sequence is coupled to the layer by a via, a first portion of the individual power rail is in the first layer of the support structure, and a second portion of the individual power rail is in the second layer of the support structure.

10. The IC structure according to claim 9, wherein the first semiconductor structure and the second semiconductor structure are between the layer and the sequence of power rails.

11. The IC structure according to claim 9, wherein a resistance of a combination of the individual power rail in the sequence and the via is in a range from 5 ohm to 20 ohm.

12. The IC structure according to claim 9, wherein the individual power rail is between the first semiconductor structure and the second semiconductor structure.

13. The IC structure according to claim 9, wherein the first semiconductor structure or second semiconductor structure comprises a fin, nanoribbon, or nanowire of a semiconductor material.

14. An integrated circuit (IC) structure, comprising:

a transistor, the transistor comprising:

a source region, a drain region, a first semiconductor structure, a second semiconductor structure, and a gate, the gate having a first portion at least partially wrapping around a portion of the first semiconductor structure and having a second portion at least partially wrapping around a portion of the second semiconductor structure;

a first layer comprising a first electrically conductive material, the first layer coupled to the transistor;

a second layer comprising a second electrically conductive material; and a sequence of power rails, the sequence of power rails coupled to the first layer by a sequence of first vias and coupled to the second layer by a sequence of second vias, wherein:

an individual power rail in the sequence of power rails is coupled to the drain region by an individual first via of the sequence of first vias, the individual power rail is coupled to the source region through an individual second via in the sequence of second vias, the first semiconductor structure or second semiconductor structure comprises a fin, nanoribbon, or nanowire of a semiconductor material, and the individual power rail is between the first semiconductor structure and the second semiconductor structure.

15. The IC structure according to claim 14, wherein the first layer is between the second layer and the sequence of power rails.

16. The IC structure according to claim 14, wherein:

the first layer comprises a first section, a second section, and a first gap between the first section and second sections;

the second layer comprises a third section, a fourth section, and a second gap between the third section and fourth sections;

a first power rail of the sequence of power rails comprises a first end coupled to the first section of the first layer and a second end connected to the third section of the second layer;

a second power rail of the sequence of power rails comprises a third end connected to the third section of the second layer and a fourth end connected to the second section of the first layer; and the first power rail is adjacent to the second power rail in the sequence of power rails.

17. The IC structure according to claim 14, wherein a resistance of a combination of the individual power rail and individual first via is at least 5 ohm.

18. The IC structure according to claim 14, further comprising a support structure comprising a layer, wherein the layer comprises a semiconductor material and the sequence of power rails is buried in the support structure.

19. The IC structure according to claim 18, wherein:

the support structure further comprises an additional layer;

the additional layer comprises an electrically insulation material;

a first portion of the individual power rail is in the layer; and a second portion of the individual power rail is in the additional layer.

20. The IC structure according to claim 14, further comprising another transistor, wherein the individual power rail is between the transistor and the another transistor.

* * * * *